(12) United States Patent
Todd et al.

(10) Patent No.: US 8,069,269 B2
(45) Date of Patent: *Nov. 29, 2011

(54) METHODS AND APPARATUS FOR ACCESSING CONTENT IN A VIRTUAL POOL ON A CONTENT ADDRESSABLE STORAGE SYSTEM

(75) Inventors: Stephen Todd, Shrewsbury, MA (US); Michael Kilian, Harvard, MA (US); Tom Teugels, Schoten (BE)

(73) Assignee: EMC Corporation, Hopkinton, MA (US)

( * ) Notice: Subject to any disclaimer, the term of this patent is extended or adjusted under 35 U.S.C. 154(b) by 387 days.

This patent is subject to a terminal disclaimer.

(21) Appl. No.: 10/911,330

(22) Filed: Aug. 4, 2004

(65) Prior Publication Data
US 2006/0031653 A1 Feb. 9, 2006

(51) Int. Cl.
*G06F 13/00* (2006.01)
*G06F 3/00* (2006.01)
(52) U.S. Cl. .............. 710/5; 711/108; 711/154; 711/170
(58) Field of Classification Search .................. 711/108, 711/154, 170; 365/49.1; 710/5
See application file for complete search history.

(56) References Cited

U.S. PATENT DOCUMENTS

| | | | | |
|---|---|---|---|---|
| 4,758,892 A | * | 7/1988 | Bloomfield | 348/585 |
| 5,617,537 A | * | 4/1997 | Yamada et al. | 709/214 |
| 5,696,930 A | * | 12/1997 | Garetz et al. | 710/3 |
| 5,909,540 A | * | 6/1999 | Carter et al. | 714/4 |
| 6,292,795 B1 | * | 9/2001 | Peters et al. | 707/3 |
| 6,374,326 B1 | * | 4/2002 | Kansal et al. | 711/108 |
| 6,473,846 B1 | * | 10/2002 | Melchior | 711/170 |
| 6,636,940 B1 | * | 10/2003 | Hodges | 711/112 |
| 6,687,786 B1 | | 2/2004 | Wong et al. | |
| 6,779,084 B2 | * | 8/2004 | Wolrich et al. | 711/118 |
| 6,804,753 B1 | * | 10/2004 | Moody et al. | 711/163 |
| 6,876,558 B1 | * | 4/2005 | James et al. | 365/49.1 |
| 6,978,343 B1 | * | 12/2005 | Ichiriu | 711/108 |
| 6,987,684 B1 | * | 1/2006 | Branth et al. | 365/49 |
| 7,058,642 B2 | * | 6/2006 | Kurupati et al. | 707/101 |
| 7,315,865 B1 | * | 1/2008 | Jernigan, IV | 707/102 |
| 7,386,658 B2 | * | 6/2008 | Rotithor et al. | 711/108 |
| 2002/0129216 A1 | * | 9/2002 | Collins | 711/170 |
| 2003/0182501 A1 | * | 9/2003 | George et al. | 711/114 |
| 2004/0030806 A1 | * | 2/2004 | Pandya | 709/250 |
| 2004/0100811 A1 | | 5/2004 | Pereira et al. | |

(Continued)

OTHER PUBLICATIONS

U.S. Appl. No. 10/910,985, filed Aug. 4, 2004, Stephen J. Todd, et al.

(Continued)

*Primary Examiner* — Alford Kindred
*Assistant Examiner* — Ernest Unelus
(74) *Attorney, Agent, or Firm* — Muirhead and Saturnelli, LLC

(57) ABSTRACT

One embodiment is directed to a method of segregating one or more content addressable storage systems into a plurality of virtual pools. The virtual pools can be allocated to different content sources and/or can be assigned to different storage system capabilities. Another embodiment is directed to transmitting with an input/output request for a content unit information specifying at least one storage capability to be applied to the content unit, and/or receiving such an I/O and implementing the specified storage system capabilities. Another embodiment is directed to extracting from an I/O request from a source information relating to an impact of the I/O on at least one characteristic of the content units stored on a CAS system from the source. Another embodiment is directed to storing information for content identifying the source and/or reading information associated with a stored content unit and determining based at least in part thereon, at least one characteristic of the content units stored from a source.

66 Claims, 13 Drawing Sheets

U.S. PATENT DOCUMENTS

| | | |
|---|---|---|
| 2004/0193740 A1 | 9/2004 | Kasmirsky et al. |
| 2004/0220975 A1* | 11/2004 | Carpentier et al. ........... 707/200 |
| 2006/0004912 A1* | 1/2006 | Najam et al. .................. 709/213 |
| 2006/0004956 A1* | 1/2006 | Madajczak .................... 711/108 |

OTHER PUBLICATIONS

U.S. Appl. No. 10/911,248, filed Aug. 4, 2004, Stephen J. Todd, et al.

U.S. Appl. No. 10/911,247, filed Aug. 4, 2004, Stephen J. Todd, et al.

U.S. Appl. No. 10/911,360, filed Aug. 4, 2004, Stephen J. Todd, et al.

D. Thiebaut et al., "Improving Disk Cache Hit-Ratios Through Cache Partitioning," IEEE Transactions on Computers, vol. 41, No. 6, pp. 665-676, published Jun. 1992.

British Search Report.

* cited by examiner

METHODS AND APPARATUS FOR ACCESSING CONTENT IN A VIRTUAL POOL ON A CONTENT ADDRESSABLE STORAGE SYSTEM

FIELD OF THE INVENTION

The present invention relates to computer systems including storage systems.

DESCRIPTION OF THE RELATED ART

Virtually all computer application programs rely on storage that may be used to store computer code and data manipulated by the computer code. A typical computer system includes one or more host computers or servers that execute such application programs and one or more storage systems that store data. In such a computer system, a storage system typically includes a plurality of physical storage devices (e.g., disk devices) on which the data is stored.

Some storage systems receive and process access requests that identify data or other content using a content address, rather than an address that specifies where the data is physically or logically stored in the storage system. As used herein, a content address is an address that is computed based, at least in part, on the content of its corresponding unit of content, which can be data and/or metadata. For example, a content address for a unit of content may be computed by hashing the unit of content and using the resulting hash value to form at least part of the content address. Storage systems that identify and access content units by a content address are referred to herein as content addressable storage (CAS) systems.

FIGS. 1A and 1B illustrate examples of the processing of two different types of access requests by a CAS system: write requests and read requests, respectively. FIG. 1A shows a computer system that includes a CAS system 203 and a host computer 201, with the host computer 201 sending a write request 205 to the CAS system. Write request 205 includes a content unit 207 that is to be stored on the CAS system. In response to receiving the write request and/or storing the content unit, the CAS system may compute the content address of the content unit and send response 209 back to host computer 201 to acknowledge receipt of the write request and to return the content address for content unit 207 to the host computer, so that the host computer may later use the content address to access content unit 207. Alternatively, or in addition, the host 207 may generate the content address 209 and pass it to the storage system along with content unit 207.

FIG. 1B illustrates an example of the processing of a read request in the computer system of FIG. 1B. Host computer 201 sends the read request 211 to CAS system 203. The read request identifies the content unit to be returned by CAS system 203 by including the content address 209 in the request. In response to read request 211, CAS system 203 returns to host computer 201 the content unit 207 that corresponds to content address 209.

Because the content address associated with a content unit may be independent of where the content unit is stored, a host computer or application program need not be aware of the physical or logical storage location of the content unit on the CAS system. The host computer or application program may simply refer to the content unit by the content address. The CAS system may determine the storage location of the content unit, based on its content address, in a manner that is transparent to the host computer and any application executing thereon.

SUMMARY OF THE INVENTION

One illustrative embodiment of the invention is directed to a method of managing content storage in a computer system comprising at least one host and at least one content addressable storage (CAS) system that performs a plurality of operations on content units for the at least one host, wherein the at least one host identifies a content unit on the at least one CAS system using a content address generated based, at least in part, on the content of the content unit, wherein the at least one host comprises a plurality of application programs executing thereon, the plurality of application programs comprising at least first and second application programs. The method comprises acts of: (A) segregating the at least one CAS system into a plurality of virtual pools of CAS storage comprising at least first and second virtual pools; and (B) allocating each of the plurality of virtual pools to at least one of the plurality of application programs so that each one of the plurality of application programs is permitted to access only content units stored in the at least one CAS system that are included in one of the plurality of virtual pools allocated to the one of the application programs and is not permitted to access content units stored in the at least one CAS system that are not included in one of the plurality of virtual pools allocated to the one of the application programs. Another illustrative embodiment is directed to at least one computer readable medium that, when executed on a computer system, performs the above described method.

A further illustrative embodiment is directed to an apparatus for use in a computer system comprising at least one host and at least one content addressable storage (CAS) system that performs a plurality of operations on content units for the at least one host, wherein the at least one host identifies a content unit on the at least one CAS system using a content address generated based, at least in part, on the content of the content unit, wherein the at least one host comprises a plurality of application programs executing thereon, the plurality of application programs comprising at least first and second application programs. The apparatus comprises: at least one storage device; and at least one processor, coupled to the at least one storage device, that segregates the at least one CAS system into a plurality of virtual pools of CAS storage comprising at least first and second virtual pools; and allocates each of the plurality of virtual pools to at least one of the plurality of application programs so that each one of the plurality of application programs is permitted to access only content units stored in the at least one CAS system that are included in one of the plurality of virtual pools allocated to the one of the application programs and is not permitted to access content units stored in the at least one CAS system that are not included in one of the plurality of virtual pools allocated to the one of the application programs.

Another illustrative embodiment is directed to a method of managing content storage in a computer system comprising at least one host and at least one content addressable storage (CAS) system that performs a plurality of operations on content units for the at least one host, wherein the at least one host identifies a content unit on the at least one CAS system using a content address generated based, at least in part, on the content of the content unit, wherein the at least one host comprises at least one application program executing thereon. The method comprises acts of: (A) segregating the at least one CAS system into a plurality of virtual pools of CAS storage comprising at least first and second virtual pools; and (B) assigning different storage system capabilities to the first and second virtual pools. A further illustrative embodiment is directed to at least one computer readable medium that, when executed on a computer system, performs the above described method.

Another illustrative embodiments is directed to an apparatus for use in a computer system comprising at least one host and at least one content addressable storage (CAS) system that performs a plurality of operations on content units for the at least one host, wherein the at least one host identifies a content unit on the at least one CAS system using a content address generated based, at least in part, on the content of the content unit, wherein the at least one host comprises at least one application program executing thereon. The apparatus comprises: at least one storage device; and at least one processor, coupled to the at least one storage device, adapted to: segregate the at least one CAS system into a plurality of virtual pools of CAS storage comprising at least first and second virtual pools; and assign different storage system capabilities to the first and second virtual pools.

A further illustrative embodiment is directed to a method of processing input/output (I/O) requests in a computer system comprising at least one host and at least one content addressable storage (CAS) system that performs a plurality of operations on content units for the at least one host, wherein the at least one host identifies a content unit on the at least one CAS system using a content address generated based, at least in part, on the content of the content unit, wherein the at least one CAS system is segregated into a plurality of virtual pools of CAS storage comprising at least first and second virtual pools, each of the plurality of virtual pools comprising a different set of storage resources in the at least one CAS system. The method comprises acts of: (A) in response to receipt of a first I/O request, determining at least one of the plurality of virtual pools to which the first I/O request is directed to; and (B) forwarding the first I/O request to the set of storage resources that comprise the at least one of the plurality of virtual pools to which the first I/O request is directed. Another illustrative embodiment is directed to at least one computer readable medium that, when executed on a computer system, performs the above described method.

A further illustrative embodiment is directed to an apparatus for use in a computer system comprising at least one host and at least one content addressable storage (CAS) system that performs a plurality of operations on content units for the at least one host, wherein the at least one host identifies a content unit on the at least one CAS system using a content address generated based, at least in part, on the content of the content unit, wherein the at least one CAS system is segregated into a plurality of virtual pools of CAS storage comprising at least first and second virtual pools, each of the plurality of virtual pools comprising a different set of storage resources in the at least one CAS system. The apparatus comprises: an input adapted to receive input/output (I/O) requests; and at least one processor, coupled to the input, adapted to: in response to receipt of a first I/O request from the input, determine at least one of the plurality of virtual pools to which the first I/O request is directed to; and forward the first I/O request to the set of storage resources that comprise the at least one of the plurality of virtual pools to which the first I/O request is directed.

Another illustrative embodiment is directed to a method for use in a computer system comprising at least one host and at least one content addressable storage (CAS) system that performs a plurality of operations on content units for the at least one host, wherein the at least one host accesses a content unit on the at least one CAS system using a content address generated based, at least in part, on the content of the content unit, wherein the at least one CAS system is segregated into a plurality of virtual pools of CAS storage comprising at least first and second virtual pools, the method comprising an act, performed by the at least one host, of: (A) issuing a first input/output (I/O) request to the at least one CAS system requesting access to at least one content unit stored on the at least one CAS system, wherein the first I/O request comprises information identifying at least one of the plurality of virtual pools. A further illustrative embodiment is directed to at least one computer readable medium that, when executed on a computer system, performs the above described method.

Another illustrative embodiment is directed to at least one host computer for use in a computer system that comprises the at least one host computer and at least one content addressable storage (CAS) system that performs a plurality of operations on content units for the at least one host computer, wherein the at least one host computer accesses a content unit on the at least one CAS system using a content address generated based, at least in part, on the content of the content unit, wherein the at least one CAS system is segregated into a plurality of virtual pools of CAS storage comprising at least first and second virtual pools. The at least one host computer comprises: an output adapted to issue input/output (I/O) requests; and a processor, coupled to the at least one output, adapted to: issue, through the output, a first I/O request to the at least one CAS system requesting access to at least one content unit stored on the at least one CAS system, wherein the first I/O request comprises information identifying at least one of the plurality of virtual pools.

A further illustrative embodiment is directed to a method of managing content storage in a computer system comprising at least one host and at least one content addressable storage (CAS) system that performs a plurality of operations on content units for the at least one host, wherein the at least one host accesses a content unit on the at least one CAS system using an identifier that comprises a content address generated based, at least in part, on the content of the content unit, wherein the at least one host comprises at least one application program executing thereon. The method comprises acts of: (A) transmitting at least one input/output (I/O) request from the at least one host requesting that the first content unit be stored on the at least one CAS system; and (B) including in the at least one I/O request capability information specifying at least one storage system capability to be applied by the at least one CAS system to the first content unit stored thereon. Another illustrative embodiment is directed to at least one computer readable medium that, when executed on a computer system, performs the above described method.

A further illustrative embodiment is directed to an apparatus for use in a computer system comprising at least one host computer and at least one content addressable storage (CAS) system that performs a plurality of operations on content units for the at least one host, wherein the at least one host accesses a content unit on the at least one CAS system using an identifier that comprises a content address generated based, at least in part, on the content of the content unit, wherein the at least one host comprises at least one application program executing thereon. The apparatus comprises: an output adapted to transmit input/output (I/O) requests; and at least one processor, coupled to the output, adapted to: transmit, through the output, at least one I/O request requesting that the first content unit be stored on the at least one CAS system; and include in the at least one I/O request capability information specifying at least one storage system capability to be applied by the at least one CAS system to the first content unit stored thereon.

Another illustrative embodiment is directed to a method of managing content storage in a computer system comprising at least one host and at least one content addressable storage (CAS) system that performs a plurality of operations on content units for the at least one host, wherein the at least one host accesses a content unit on the at least one CAS system using an identifier that comprises a content address generated based, at least in part, on the content of the content unit, wherein the at least one host comprises at least one application program executing thereon. The method comprises acts of: (A) receiving, at the at least one CAS system, at least one input/output (I/O) request requesting that the first content unit be stored on the at least one CAS system, wherein the at least one I/O request comprises capability information specifying at least one storage system capability to be applied by the at least one CAS system to the first content unit; (B) examining the capability information in the at least one I/O request; and (C) implementing the storage system capability specified by the capability information. A further illustrative embodiment is directed to at least one computer readable medium that, when executed on a computer system, performs the above described method.

Another illustrative embodiment is directed to an apparatus for use in a computer system comprising at least one host and the at least one content addressable storage (CAS) system that performs a plurality of operations on content units for the at least one host, wherein the at least one host accesses a content unit on the at least one CAS system using an identifier that comprises a content address generated based, at least in part, on the content of the content unit, wherein the at least one host comprises at least one application program executing thereon. The at least one CAS system comprises: an input adapted to receive input/output (I/O) requests; and at least one processor, coupled to the input, adapted to: receive, through the input, at least one I/O request requesting that the first content unit be stored on the at least one CAS system, wherein the at least one I/O request comprises capability information specifying at least one storage system capability to be applied by the at least one CAS system to the first content unit; examine the capability information in the at least one I/O request; and implement the storage system capability specified by the capability information.

A further illustrative embodiment is directed to a method of tracking content storage in a computer system comprising at least one server and a content addressable storage (CAS) system that performs a plurality of operations on content units for at least one content source, wherein the at least one content source identifies a content unit on the CAS system using a content address generated based, at least in part, on the content of the content unit, wherein the at least one content source comprises a plurality of content sources comprising at least first and second content sources. The method comprises an act of: (A) extracting from at least one input/output (I/O) communication passing between the first content source and the CAS system information relating to an impact of the at least one I/O communication on at least one characteristic of the content units stored in the CAS system from the first content source. Another illustrative embodiment is directed to at least one computer readable medium that, when executed on a computer system, performs the above described method.

A further illustrative embodiment is directed to an apparatus for use in a 10 computer system that comprises at least one server and a content addressable storage (CAS) system that performs a plurality of operations on content units for at least one content source, wherein the at least one content source identifies a content unit on the CAS system using a content address generated based, at least in part, on the content of the content unit, wherein the at least one content source comprises a plurality of content sources comprising at least first and second content sources. The apparatus comprises: an input adapted to receive input/output (I/O) communications passing between the first content source and the CAS system; and at least one processor, coupled to the input, adapted to extract from at least one I/O communication, received through the input, information relating to an impact of the at least one I/O communication on at least one characteristic of the content units stored in the CAS system from the first content source.

Another illustrative embodiment is directed to a method of tracking content storage in a computer system comprising at least one server and a content addressable storage (CAS) system that performs a plurality of operations on content units for at least one content source, wherein the at least one content source identifies a content unit on the CAS system using a content address generated based, at least in part, on the content of the content unit, wherein the at least one content source comprises a plurality of content sources comprising at least first and second content sources. The method comprises an act of: (A) in association with storing a first unit of content from the first content source on the CAS system, storing information that identifies the first content source as the source for the first content unit. A further illustrative embodiment is directed to at least one computer readable medium that, when executed on a computer system, performs the above described method.

Another illustrative embodiment is directed to an apparatus for use in a computer system comprising at least one server and a content addressable storage (CAS) system that performs a plurality of operations on content units for at least one content source, wherein the at least one content source identifies a content unit on the CAS system using a content address generated based, at least in part, on the content of the content unit, wherein the at least one content source comprises a plurality of content sources comprising at least first and second content sources. The apparatus comprises: at least one storage device; and at least one processor, coupled to the at least one storage device, adapted to: in association with storing a first unit of content from the first content source on the CAS system, store information that identifies the first content source as the source for the first content unit.

A further illustrative embodiment is directed to a method of tracking content storage in a computer system comprising at least one server and a content addressable storage (CAS) system that performs a plurality of operations on content units for at least one content source, wherein the at least one content source identifies a content unit on the CAS system using a content address generated based, at least in part, on the content of the content unit, wherein the at least one content source comprises a plurality of content sources comprising at least first and second content sources. The method comprises acts of: (A) reading information associated with the content units stored on the CAS system; and (B) determining, based at least in part on the information read in the act (A), at least one characteristic of the content units stored in the CAS system from the first content source. Another illustrative embodiment is directed to at least one computer readable medium that, when executed on a computer system, performs the above described method.

A further illustrative embodiment is directed to an apparatus for use in a computer system comprising at least one server and a content addressable storage (CAS) system that performs a plurality of operations on content units for at least one content source, wherein the at least one content source identifies a content unit on the CAS system using a content address generated based, at least in part, on the content of the content unit, wherein the at least one content source comprises a plurality of content sources comprising at least first and second content sources. The apparatus comprises: at least one storage device; and at least one processor, coupled to the at least one storage device, adapted to read information associated with the content units stored on the CAS system; and determine, based at least in part on the information associated with the content units stored on the CAS system, at least one characteristic of the content units stored in the CAS system from the first content source.

DETAILED DESCRIPTION

Figure 1A:
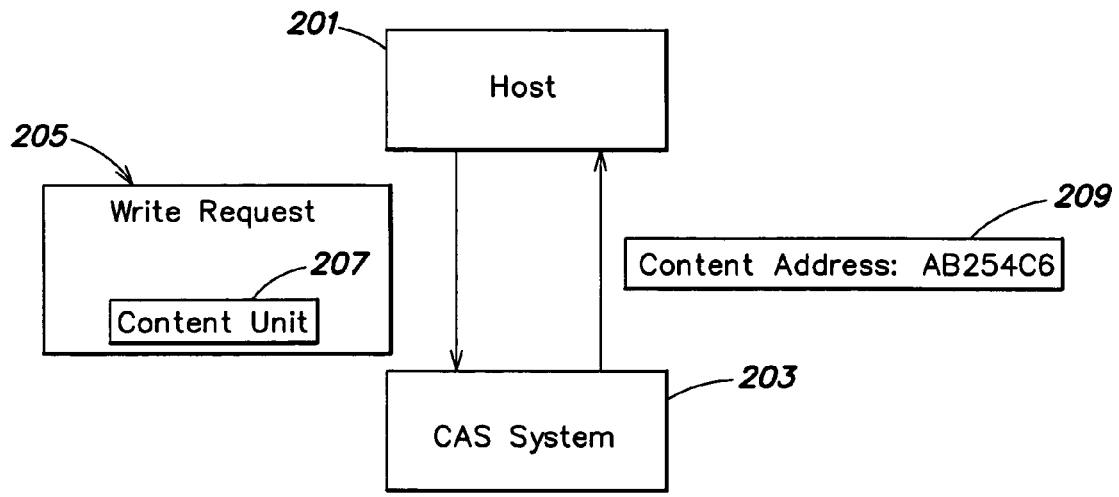
FIG. 1A illustrates the execution of a write request in a computer system, including a host computer and a CAS system, on which aspects of the present invention can be employed.
Figure 1B:
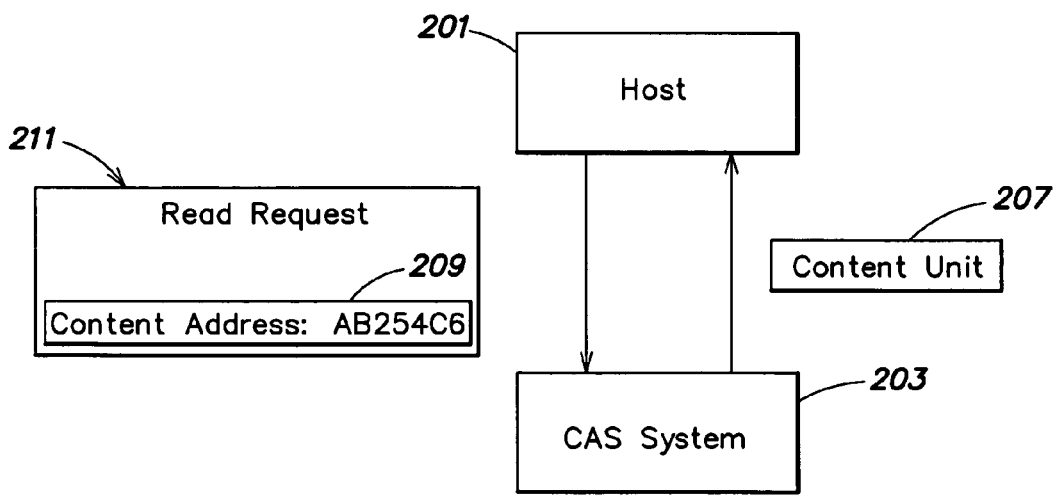
FIG. 1B illustrates the execution of a read request in the computer system of FIG. 1A.

Applicants have appreciated that because content sources (e.g., host computers or servers, application programs, other storage systems, etc.) do not specify physical or logical storage locations for content units stored in a CAS system, the content sources do not have the ability to physically or logically separate content units that are related in some way. For example, content units that are stored by the same host computer or application program may end up in entirely different physical or logical locations.

Applicants have further appreciated that various storage system capabilities (e.g., different types of delete capabilities, replication capabilities, etc.) often are tied to the physical and/or logical storage location for a content unit. Thus, the inability of the content source to specify physical or logical storage locations for content units results in an inability to ensure that consistent storage system capabilities are provided for content units that are related in some way (e.g., those written from the same host or by the same application program).

Furthermore, the inability of a content source to control which logical or physical storage resources are used to store content sourced thereby can result in an inability to separately track and report one or more characteristics of the content units stored on the storage system from any particular content source (e.g., the storage capacity used to store the content units from the particular content source, the number of content units stored from a particular content source, etc.).

One embodiment of the invention relates to segregating one or more CAS systems into a plurality of virtual pools. Each of the virtual pools may be allocated to one or more content sources so that a content source is only permitted to access content units in virtual pools that are allocated to it, and is not permitted to access content units in virtual pools that are not allocated to it.

As will be discussed in more detail below, the CAS system (s) can be segregated into a plurality of virtual pools in any of numerous ways, as this aspect of the present invention is not limited to any particular implementation technique. For example, different virtual pools can be assigned to different storage system resources (e.g., different CAS systems, different storage nodes within a CAS system, etc.) in one embodiment of the invention, or alternatively, the segregation can be performed without regard to storage system resource boundaries.

The use of virtual pools can provide a number of advantages, although the aspect of the present invention relating to virtual pools is not limited to any of the particular advantages described herein. For example, in one embodiment of the present invention, two or more virtual pools can be provided with different storage system capabilities. While the use of virtual pools is not limited in this respect, this capability is advantageous in that two or more content sources can be assigned to different virtual pools, with the result that different storage system capabilities can be applied to content stored from different content sources.

In another embodiment, tracking and reporting can be performed separately for each virtual pool. Again, while the use of virtual pools is not limited in this respect, this is advantageous in that two or more content sources can be assigned to two different virtual pools, with the result that characteristics of the content units used by each of the content sources can be tracked and reported on separately, such as the storage capacity used by each content source or the number of content units stored thereby.

As mentioned above, the aspect of the present invention that relates to segregating one or more CAS systems into virtual pools is not limited to implementations that provide different storage capabilities for different virtual pools and/or that provide separate tracking and reporting for different virtual pools. Similarly, it should be appreciated that the aspects of the present invention that relate to providing different storage capabilities and separate tracking and reporting for content in a CAS system are not limited to use with the virtual pools aspect of the present invention, as other implementations for each of these aspects of the present invention are possible that do not employ virtual pools.

For example, one embodiment of the present invention is directed to a technique that enables a content source to specify (e.g., in an input/output (I/O) request accessing a content unit) at least one storage capability to be applied by a CAS system to the content unit. The CAS system can use this information to apply the specified storage system capability to the content unit. Although not limited in this respect, this embodiment of the present invention enables one or more content sources to assign different types of storage capabilities to content units stored on a CAS system.

Similarly, another embodiment of the present invention is directed to techniques for enabling the tracking of I/O communications between a content source and a CAS system to determine an impact of the I/Os on at least one characteristic of the content units stored in a CAS system from the content source. The characteristic can relate to the amount of storage capacity in the CAS system used to store content from the specified content source. However, this aspect of the present invention is not limited in this respect, as the characteristic can alternatively relate to other types of information, including a number of content units stored by the content source.

In another embodiment of the present invention, information that identifies the source of a content unit can be stored when the content unit is stored to the CAS system. This enables the information to be read at a later time for use in determining which content sources stored which content units in the CAS system. This information can, in turn, be useful for numerous types of tracking and reporting activities, such as determining a number of content units stored by each source, the storage capacity used by each content source, etc. These determinations can be made by a host computer or separate appliance (described below) that reads the information from the CAS system(s), or may be performed internally by the CAS system(s) itself, as this aspect of the present invention is not limited to any particular implementation technique. While the two above-described aspects of the present invention (relating to (1) tracking I/O communications to extract information relating to an impact of the I/Os on a characteristic of content units stored on a storage system from a particular content source, and (2) the storing of information for content units that identifies the source of the content units) are described herein in connection with use on a CAS system, it should be appreciated that these aspects of the present invention are not limited in this respect, and can be used with any type of storage system.

As mentioned above, some embodiments of the invention relate to the use of virtual pools in a CAS system. A virtual pool is a logical grouping of storage resources and/or content units, which may be grouped based on any suitable criterion or criteria. For example, virtual pools may be defined based on the identity of the content source (e.g., a host computer, application program, other storage system, etc.) to which the virtual pool is allocated, and/or based on common access permissions for the content units grouped together in a virtual pool. Content units may also be grouped together into a virtual pool based on the storage systems capabilities are to be applied to the content units. For example, content units that are to be replicated synchronously may be grouped into one virtual pool, content units that are to be replicated asynchronously into another, and content units that are not to be replicated grouped into yet another. Content units may also be grouped together into virtual pools based on a combination of these or other criteria. The examples provided above of the criteria that can be used (either separately or collectively) to define the characteristics of a virtual pool are merely illustrative, as the invention is not limited in this respect, as any suitable criterion or criteria can be used.

It should be appreciated that the aspect of the present invention that relates to the use of virtual pools can achieve a logical segregation that limits the response of the CAS system to an access request (e.g., a read request, a write request, a query request, etc.) for a particular content unit. For example, as discussed above, in one embodiment of the present invention, different virtual pools can be assigned to different content sources (e.g., a server, an application program, another storage system, etc.). Through the use of virtual pools, the CAS system can be segregated, so that a content source has access only to the content units assigned to the virtual pool(s) allocated to that content source. Thus, an access request from a content source allocated to a particular virtual pool can be serviced only by the storage resources and/or content units allocated to that virtual pool. For example when performing a read or query operation for a content unit, the storage system will respond to the access request based only upon the content units stored within the appropriate virtual pool or pools allocated to the content source. This can provide a measure of security for the stored content, in that content units stored to the storage system from a different content source will not be used to respond to an access request from another content source, thereby maintaining the security of the content units by not sharing them with another potentially unauthorized entity that seeks access to them. For example, if a storage system were segregated into two virtual pools assigned to two different servers or application programs, each server or application program could only access the content units assigned to its corresponding virtual pool, and would not be able to access the content units of the other server or application program. Thus, each content source may be permitted to access only content units stored in the virtual pool(s) allocated to the content source.

Virtual pools may be created and administered in any suitable way as the invention is not limited in this respect. For example, to facilitate creating and administering virtual pools, in accordance with one embodiment of the present invention, each virtual pool is provided with a name or identifier, an identification of the capabilities to be applied to content units in the virtual pool, and a technique for authentication and/or authorization for servers, application programs, users, etc. seeking access to content units within the virtual pool. In addition, for the embodiments wherein virtual pools are implemented by segregating storage system resources, the administration and creation of a virtual pool may also include a mapping from the virtual pool to the storage system resources used to store the content units included therein. In addition, some technique may be employed to add storage resources to and remove storage resources from a virtual pool.

Administration of the virtual pools can, of course, also in some embodiments include editing or modifying one or more aspects of one or more of the virtual pools, as well as the ability to delete or destroy a virtual pool. In addition, in accordance with one embodiment of the present invention, a capability is provided to increase the storage capacity provided to one or more virtual pools as needs grow. This can be accomplished in any of numerous ways, as the present invention is not limited to any particular implementation technique. Similarly, a technique can also be provided for dealing with additional storage resources that can be added to the computer system and the allocation of such storage resources to one or more virtual pools. Again, this can be done in any of numerous ways as the present invention is not limited to any particular implementation techniques. Examples of possibilities for dealing with newly added storage resources can include automatically assigning the resources to the virtual pool that is most in need of additional capacity, sharing the additional storage resources equally among two or more virtual pools automatically, and holding the additional storage resources in abeyance until they are manually assigned to one or more virtual pools by an administrator.

While virtual pools may be configured by an administrator as discussed above, it should be appreciated that the present invention is not limited in this respect, and that virtual pools could be established automatically or in any other suitable way.

Figure 2:
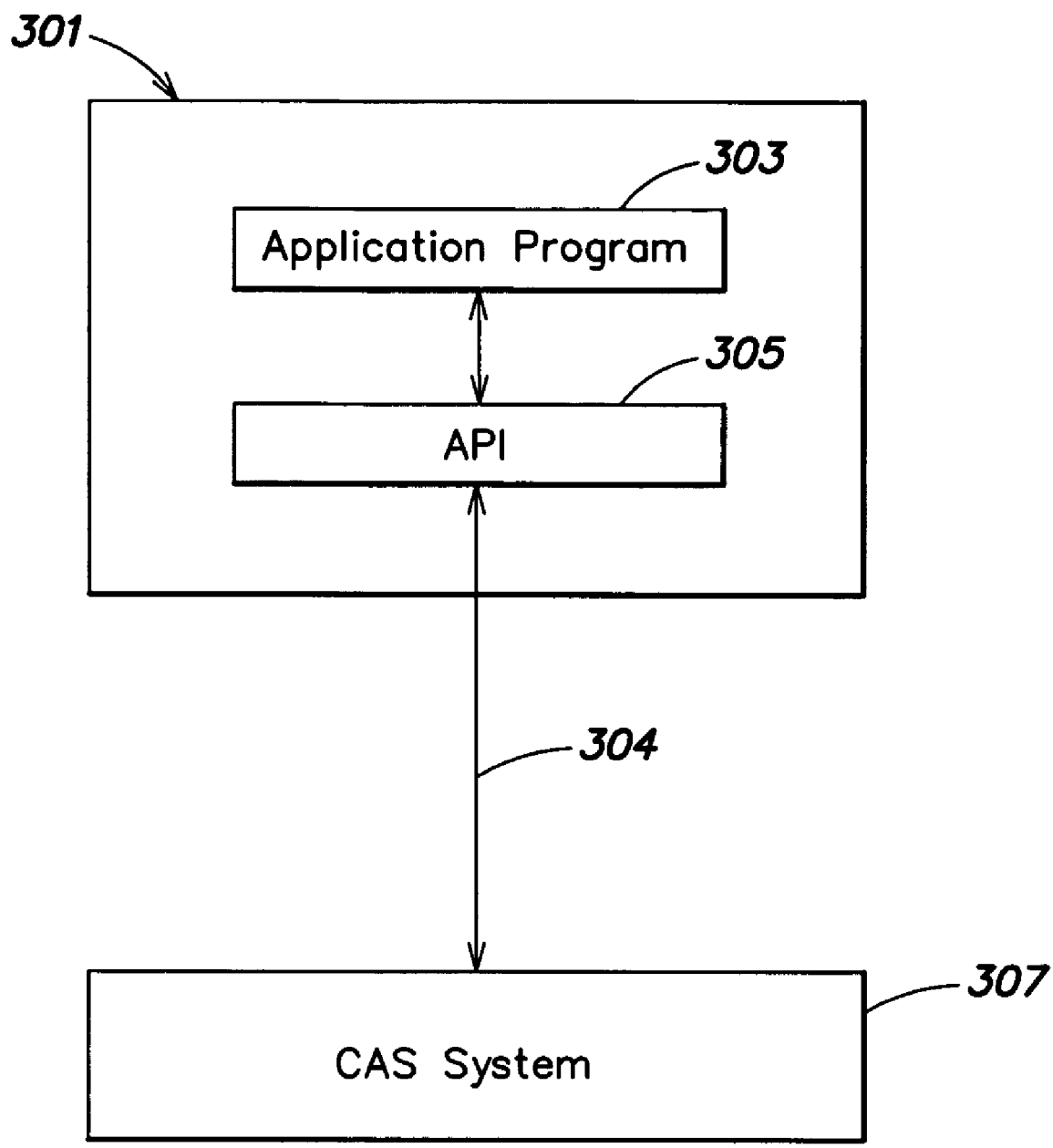
FIG. 2 illustrates a computer system on which aspects of the present invention can be implemented, the computer system including a CAS system and a host computer executing an application program and having an API to interface with the CAS system.

When storing a content unit on a CAS system that has been segregated into virtual pools, the decision as to in which virtual pool the content unit should be placed may be made in any suitable way by any suitable entity. An illustrative computer system is shown in FIG. 2, and includes a host computer 301, an application program 303 executing thereon that reads and writes units of content, and an application programming interface (API) 305 that is adapted to interface the application program 301 with the CAS system 307. Host 301 may be, for example, a server that provides resources (e.g., data storage, email, and/or other services), a client (e.g., a general-purpose computer system operated by a user), a network component (e.g., a switch), or any other type of computer. Host 301 is coupled by a communication link 304 to storage system 307 so that the host 301 can use the storage system 307 to store and retrieve content units. The link 304 can be any type of communication link, including any type of network or direct connection.

Application program 303 may be any computer program that a user or administrator of host 301 uses and that stores content to and/or retrieves content from storage system 307. Application program 303 is linked with API 305 so that application program 303 may use API 305 to communicate with storage system 307.

API 305 may include, for example, computer object code that is provided to the programmer of application program 303. The computer object code may include routines that may be used to communicate with the storage system. When linked with API 305, an application program may call these routines to communicate with storage system 307. API 305 may be linked with any number of applications, and shields the programmer of application program 303 from the internal protocol by which storage system 307 communicates. It should be appreciated that the aspects of the present invention described herein are not limited to use with a system that employs an API on the host to facilitate communication between the host 301 and the storage system 307, as the nature of the host/storage system interface can be implemented in any of numerous ways. The present invention is not limited to any particular implementation technique. As an example of one alternative implementation, application 303 can be customized to communicate directly with the storage system 307.

In one embodiment, when storing a content unit to storage system 307, application program 303 may specify a virtual pool to which the content unit is to be assigned. The identification of the virtual pool may be included in a communication or input/output (I/O) request from API 305 to storage system 307 to store the content unit, and storage system 307 may assign the content unit to the appropriate virtual pool based on the information included in the request. In one embodiment, the virtual pool may be identified using an identifier separate from the identifier (e.g., content address) used to access the content unit.

In another embodiment, the API may determine which virtual pool a content unit is assigned to. The API may make the decision in any suitable way. For example, when storage system 307 includes a separate virtual pool to store the content units from each application program and all the content units from an application program are stored in the same virtual pool, API 305 may determine which application program is making the request to store the content unit, and may send a request to storage system 307 indicating that the content unit is to be placed in the virtual pool associated with that application program. When the virtual pool is determined by the API, the application program 303 can be informed of the determination. Alternatively, application program 303 need not be aware of which virtual pool the content unit is stored in, or even that the storage system 307 is segregated into virtual pools.

When the content units stored by a particular application program are stored in different virtual pools having different characteristics (e.g., different storage system capabilities), the application program may specify to the API the desired characteristics for the storage of the content unit. The API may then select a virtual pool that corresponds to the characteristics requested by the application program. If a virtual pool that corresponds to the characteristics requested by the application program does not exist (e.g., a particular combination of storage system capabilities), then the API may create a virtual pool that corresponds to those characteristics.

In an alternative embodiment, the application program may be aware of the virtual pools on the storage system and their relevant characteristics, and may simply specify to the API the desired virtual pool for the content unit.

As mentioned above, the manner in which a content unit can be assigned to a particular virtual pool is not limited to the examples provided above, as numerous other assignment techniques are possible. The assignment can be made by any entity in the computer system, including the host computer, a CAS system, an appliance or network component, etc. In addition, the assignment techniques discussed above are not mutually exclusive, as it is contemplated that different assignment techniques can be employed in combination.

Virtual pools may be identified and/or specified in any suitable way. For example, a virtual pool, upon creation or at any other suitable time, may be assigned an identifier (e.g., by a system administrator or otherwise). An application program, API or other content source may use this identifier to identify a particular virtual pool to which a particular content unit is to be stored. Similarly, in the embodiments of the present invention in which information can be read from the storage system to identify the virtual pool(s) to which one or more content units are stored, the identifier can be used to identify the virtual pool(s).

Figure 3:
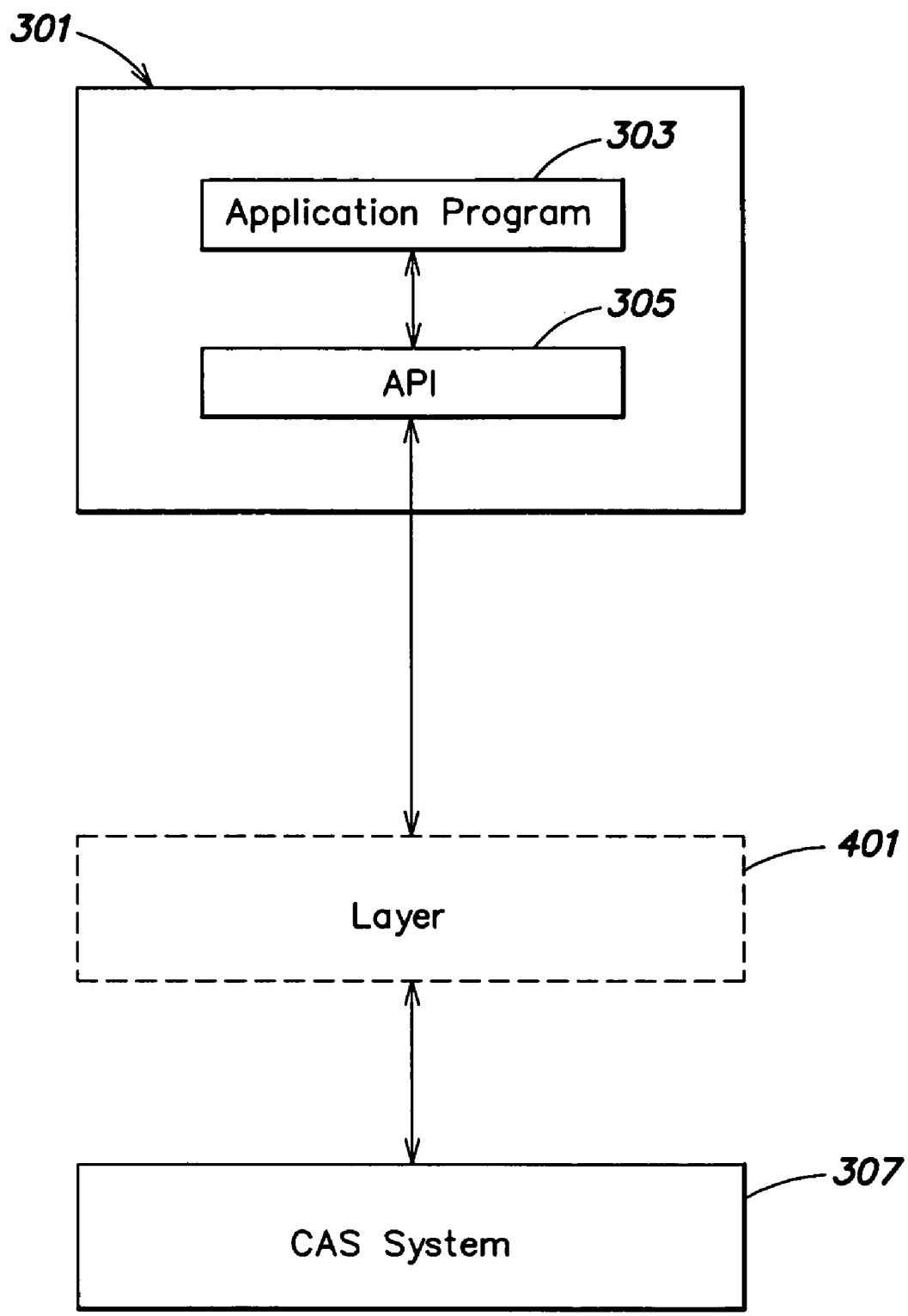
FIG. 3 illustrates a computer system on which aspects of the present invention can be implemented, the computer system including a host computer, a CAS system and a software layer 401 that participates in communication therebetween.

In another embodiment, the decision as to which virtual pool a content unit belongs may be made by a layer of software separate from the application program or API. An example of such a layer of software is described in commonly assigned U.S. patent application Ser. No. 10/836,415, entitled "METHODS AND APPARATUS FOR PROCESSING ACCESS REQUESTS IN A CONTENT ADDRESSABLE COMPUTER SYSTEM", which is incorporated herein by reference. As shown in FIG. 3, layer 401 receives access requests from API 305 and forwards the access requests to a CAS system 307. It should be understood that although only a single CAS system 307 is depicted in the computer system of FIG. 3, the computer system may include multiple CAS systems, and layer 401 may forward the request to one or more of the CAS systems. Layer 401 is illustrated in dashed lines to indicate that the layer may execute anywhere in the computer system, such as on the host computer, the CAS system, and/or a separate appliance that is situated between the host computer and CAS system. Layer 401 may receive a request to store a content unit, determine a virtual pool to which the content unit is to be assigned, and forward the request to store the content unit to the CAS system, with the forwarded request identifying the virtual pool for the content unit. However, in embodiments of the invention wherein a CAS system is allocated to each virtual pool, the forwarded request need not identify the virtual pool for the content units, as all content units stored on a particular CAS system belong to the same virtual pool. In such embodiments, Layer 401 may forward the request to store the content unit to the CAS system allocated to the virtual pool in which the content unit belongs, such that including information that identifies the virtual pool for the content unit is optional.

Layer 401 may determine the virtual pool for a content unit in any suitable way, including but not limited to, any of the selection techniques discussed above for the API 305. As a further example, layer 401 may choose the virtual pool based on which host or application program initiated the request to store the content. In one embodiment, layer 401 segregates the CAS system into virtual pools in a manner that is transparent to the host computer. Of course, the aspect of the present invention that employs the layer 401 to assign content units to a virtual pool is not limited in this respect, as any assignments made by the layer 401 can alternatively be provided to the host computer(s) as well. In addition, it should also be appreciated that the assignment of a content unit to a virtual pool by the layer 401 can alternatively occur prior to the host computer 301 transmitting the content unit directly to the CAS system 307. In such an embodiment, the layer 401 may provide the virtual pool assignment to the host 301, and the host computer 301 can thereafter include the virtual pool information in an input/output (I/O) communication sent directly (i.e., without passing through the layer 401) to the CAS system 307.

As mentioned above, in some embodiments of the invention, storage system capabilities and/or access permissions may be assigned to one or more content units in a CAS system without logically grouping the content units into virtual pools. This can be done in any suitable way, as this aspect of the present invention is not limited to any particular implementation technique. For example, information may be maintained (on the CAS system 307, in the layer 401 or elsewhere) for each content unit specifying which storage system capabilities are to be applied to the content unit and/or which hosts, users, or application programs are permitted to access the content unit. Of course, it should be appreciated that providing different storage system capabilities and/or access permissions for one or more content units can also be performed using the virtual pool aspect of the present invention, such that the information that may be maintained for each content unit can specify a virtual pool to which the content unit belongs, and additional information can be maintained that defines the storage capabilities and/or access permissions defined for the various virtual pools.

The aspects of the present invention described herein, both those relating to virtual pools that may provide different storage system capabilities and the assignment of different storage system capabilities to one or more content units without necessarily grouping them into virtual pools, can be used with storage systems having any of numerous types of storage system capabilities, as the present invention is not limited in this respect. Examples of such storage system capabilities may include, for example, replication capabilities (e.g., don't replicate, replicate immediately, replicate at a specified time, etc.); deletion capabilities (e.g., prevent deletion, shred on delete, retain for a specified retention period as specified in some of the applications listed in Table 1 below, turn on or off garbage collection utilities of the type described in some of the applications listed in Table 1, etc.); permission capabilities; quality of service capabilities (e.g., when a content unit is accessed, the priority with which the access request is serviced may depend on the quality of service parameters assigned to the content unit, specifying parameters such as a number of connections allowed for a virtual pool, a rate of I/O operations allowed, a rate of data transfer allowed, etc.); caching capabilities (e.g., specifying whether the content unit is to be cached and specifying various types of caching); indexing and searching capabilities (e.g., content units written to a virtual pool can be scanned for certain specified information, such as a keyword, and can be indexed for later retrieval by a search for the information detected by the scan); logging capabilities (e.g., maintaining a historical record of certain operations, such as tracking every access to a particular virtual pool or tracking a particular type of operation, such as all delete operations).

Another example of a storage system capability can include the enforcement of storage space quotas or restrictions of various types. For example, the storage system may restrict the size of any individual content unit that may be stored to the storage system or to a particular virtual pool, the number of content units that may be stored in any particular virtual pool, and/or the storage capacity used by any particular virtual pool. If one or more storage resource restrictions or quotas would be exceeded in response to an I/O communication that seeks to write one or more content units to the storage system, the storage system may enforce the storage system capability by rejecting the request.

Another storage system capability that may be assigned to one or more virtual pools relates to the structure of content addresses for content units. In one embodiment, content units stored to a same virtual pool may all have the same content address structure, but the content address structure may vary between different virtual pools. For example, content addresses may include a hash value alone, or may include a hash value in combination with any one or more of a guaranteed unique identifier (GUID) that assists in guaranteeing that no two content units have the same content address, a timestamp that indicates the time when the content unit was stored to the storage system, or any other suitable information. The examples of content address structures described herein are merely illustrative. Any suitable content address structure may be used, as the invention is not limited in this respect.

It should be appreciated that the storage system capabilities described above are only examples of the capabilities that may be provided in a storage system. As should be clear from the foregoing, the aspects of the present invention that relate to providing different storage system capabilities for different virtual pools, and to assigning one or more storage system capabilities to content units independent of the use of virtual pools, are not limited to use with any specific types of storage system capabilities, as these aspects of the present invention can be employed with any type of storage system capability provided on a storage system, and can implement any set of policies including various combinations of storage system capabilities.

The aspect of the present invention that relates to assigning different storage system capabilities to different content units can be implemented in any of numerous ways, as this aspect of the present invention is not limited to any particular implementation technique. In accordance with one embodiment discussed below, the storage system is configured to include one or more groups of storage system resources (e.g., physical or logical storage system resources) configured to provide the desired storage system capabilities, and then each content unit is allocated to a storage system resource that provides the desired storage system capabilities. As will be discussed in more detail below, when this aspect of the present invention is implemented by segregating the CAS system into different virtual pools, the storage system resources can be segregated into various groups that form the virtual pools and each provides the desired set of storage system capabilities.

It should be appreciated that when different storage system capabilities are assigned to content units by segregating storage system resources into a plurality of virtual pools and having different combinations of storage system capabilities applicable to each virtual pool, the I/O requests for a content unit can specify the desired storage system capabilities, either directly, or by simply indicating the appropriate virtual pool. The identification of a virtual pool can, in one embodiment, be mapped to an identification of the storage system resources that are assigned to that virtual pool and configured with the desired storage system capabilities.

Similarly, in the embodiment of the present invention wherein virtual pools are formed but without segregating storage system resources, when an I/O request identifies a virtual pool, the virtual pool identifier can be used to map to the desired storage system capabilities (e.g., by resorting to a data repository that identifies the storage system capabilities to be provided for each virtual pool), and a storage system resource can be selected or configured to provide the desired storage system capabilities. Alternatively, it should be appreciated that some storage system capabilities may be executed only upon the reading or deleting of a content unit. For example, there may be various types of delete operations supported by a storage system, with each providing various levels of security (e.g., shredding) relating to the ability of the data to be potentially recovered after deletion. In one embodiment, such capabilities can be implemented by the storage system in response to an access request (e.g., a delete request) directed to the content unit.

The embodiment wherein different storage system capabilities are allocated to content units but without segregating the storage system into virtual pools can be implemented in any of numerous ways. For example, an I/O request for a content unit may include information that specifies, either directly or indirectly, the desired storage system capabilities. Upon receipt of such an I/O request, the storage system (or a layer 401 as shown in FIG. 3) can determine the desired storage system capabilities and store the content unit on a storage system resource that is configured to provide such capabilities. Alternatively, as mentioned above, some capabilities can be implemented by the storage system in response to an access request to the content unit.

The examples discussed above concerning the way in which various storage system capabilities can be applied to different content units are provided merely for illustrative purposes, as the aspects of the present invention that relate to providing different storage system capabilities to different content units are not limited to any particular implementation technique.

The segregation of one or more CAS systems into virtual pools may be accomplished in any of numerous ways, as this aspect of the invention is not limited to any particular implementation technique. In one embodiment shown in FIG. 4, different CAS systems are used to store the different virtual pools, such that no two virtual pools share a CAS system. In the example of FIG. 5, a storage environment includes three CAS systems 501, 503, and 505.

The storage environment in FIG. 5 illustrates a number of CAS systems (or storage clusters) that work together to provide combined storage, but that are independent. As used herein, the term storage system (or cluster) refers to a group of one or more interconnected nodes that share at least one software utility that logically connects them. For example, the nodes of the storage system may share one or more software utilities that communicate, such that nodes in a storage system may monitor communications from other nodes in the system, but not from nodes outside the system. Examples of software utilities that may be shared within a storage system are described in one or more of the applications listed in Table 1.

In the embodiment shown in FIG. 5, the multiple storage systems can be managed to together provide storage resources for one or more host computers. In accordance with one embodiment of the present invention, the multiple storage systems are managed in a manner that is transparent to users (e.g., host computers or application programs executing thereon) of the storage environment, so that users may not know on which storage system a particular unit of data is stored to access that unit of data. Thus, users may treat the multiple storage systems as a single storage environment, without knowledge of which system data written to the storage environment is stored upon. Such a group of storage systems that work together to provide storage system resources can be referred to as a federation. Other techniques for arranging two or more storage systems in a federation are listed in one or more of the applications listed below in Table 1.

In the embodiment discussed above, a federation is employed to provide multiple different CAS systems to implement different virtual pools. However, it should be appreciated that federation techniques can also be employed in other ways in connection with the other embodiments of the present invention described herein. For example, in each of the figures and descriptions that refers to a CAS system, it should be appreciated that either a single CAS system or a federation of CAS systems can be employed.

Figure 4:
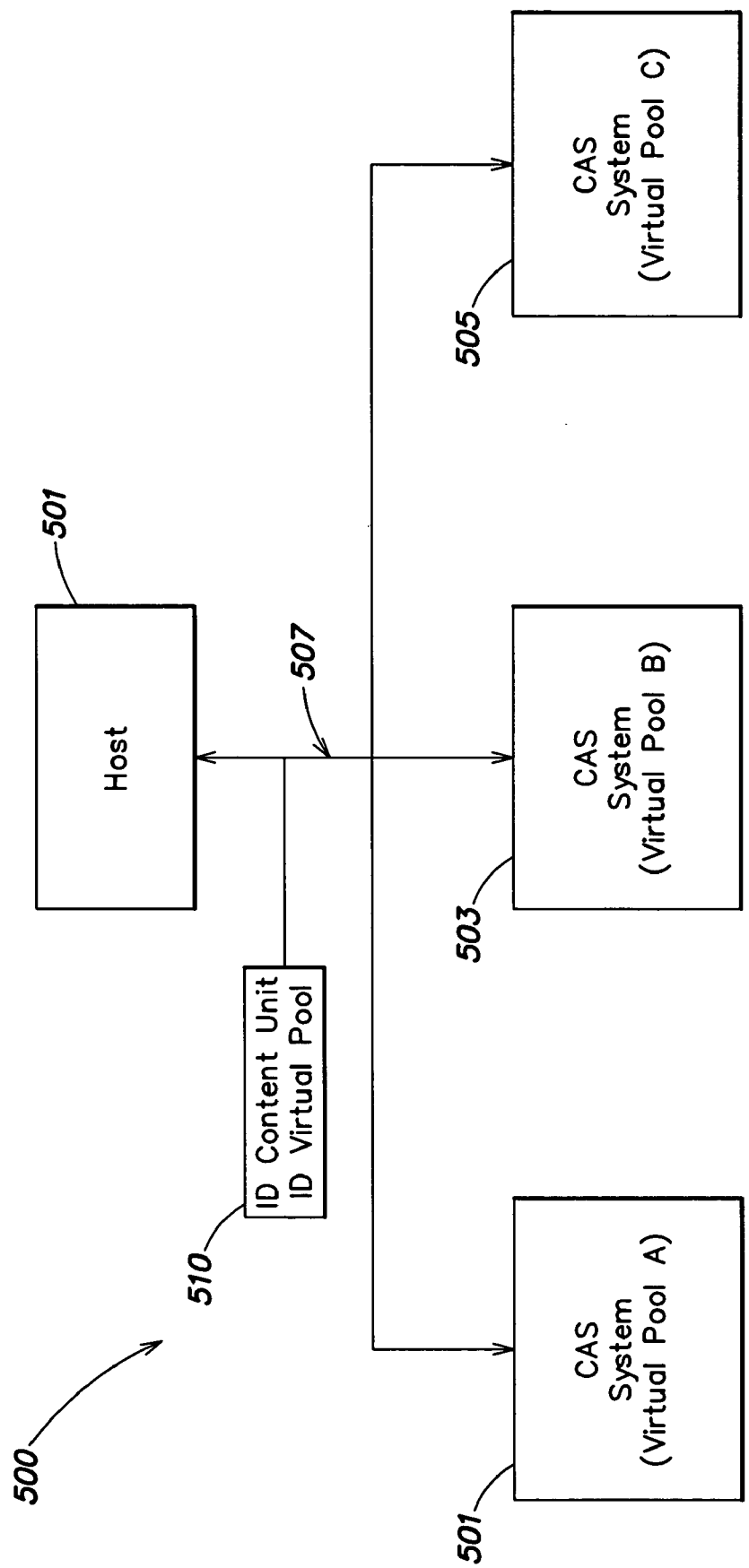
FIG. 4 illustrates a computer system including a plurality of CAS systems that have been segregated into virtual pools in accordance with one embodiment of the present invention.
Figure 5:
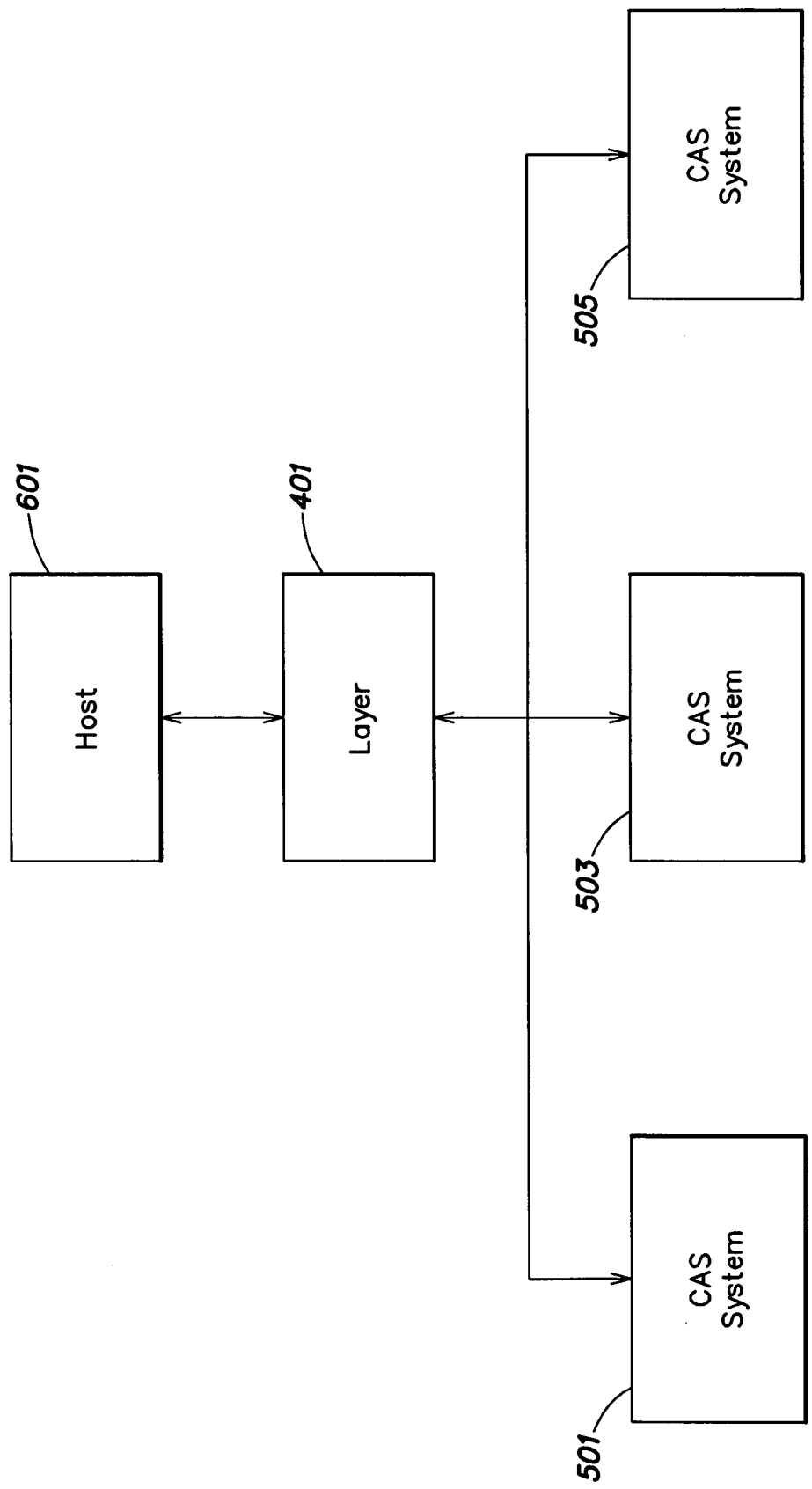
FIG. 5 illustrates the computer system of FIG. 4, but including a layer 401 that participates in communication between the host and the CAS systems.

In the example of FIG. 4, each storage system (501, 503, and 505) stores content units for one virtual pool (virtual pools A, B and C, respectively) so that storage environment 500 is logically divided into three virtual pools. The content units in each virtual pool are both physically and logically separated from content units in other virtual pools.

In addition to logically separating the virtual pools by storing them on different CAS systems, the embodiment shown in FIG. 4 can also be employed to implement the embodiment of the invention that relates to providing different storage system capabilities for different content units. For example, the different CAS systems can be configured to provide the desired different sets of storage system capabilities so that each content unit can be allocated to a virtual pool that provides the desired storage system capabilities. Similarly, storing the various virtual pools on different CAS systems also facilitates separate tracking of the number of content units and/or capacity of storage resources used by the various virtual pools, as the physical segregation facilitates separate reporting for each of the CAS systems.

The segregation of the storage environment into virtual pools by using separate CAS systems can be implemented in any of numerous ways, as the present invention is not limited to any particular implementation technique. For example, as discussed above, the storage environment can be segregated into virtual pools as shown in FIG. 4 by a system administrator.

In the example shown in FIG. 4, a single host 501 is connected to the storage environment 500 via a communication link 507. As mentioned above, the communication link can be of any type, including a dedicated communication link, shared network or any other suitable communication medium, as the aspects of the present invention are not limited in any way by the manner in which the host 501 is connected to the storage environment 500. In addition, although a single host 501 is shown connected to three CAS systems in FIG. 4, it should be appreciated that the present invention is not limited to such a configuration, and can be employed in computer systems that includes multiple hosts and any number of CAS systems. In addition, in the embodiment shown in FIG. 4, each of the virtual pools is stored on a separate CAS system. It should be appreciated that this aspect of the present invention is not limited in this respect, as a virtual pool can be stored on two or more CAS systems.

In the embodiment shown in FIG. 4, the host 501 communicates directly with the CAS environment 500. Therefore, once the storage environment 500 has been segregated into the desired virtual pools (e.g., by a system administrator), the information relating to the various virtual pools can be provided to the host 501. For example, in the embodiment wherein the host includes multiple applications that each has a different virtual pool allocated to it, the host 501 can be provided with information indicating which virtual pool is allocated to each application program. The host 501 can use that information to direct each I/O request to the CAS system that corresponds to the appropriate virtual pool. The providing of such information to the host 501, and the routing by the host 501 to the appropriate CAS system, is merely one illustrative implementation of the present invention, as the present invention is not limited to this or any other particular implementation technique.

In an alternate embodiment of the invention, the host need not route each I/O request to the CAS system that corresponds to a desired virtual pool, as this routing can be performed by one or more of the CAS systems. For example, the host may issue an I/O request 510 (FIG. 4) that includes information identifying a desired virtual pool and, when it is directed to a particular content unit, also identifies that content unit. The I/O request can be routed to any of the CAS systems, which can then determine the desired virtual pool. When the desired virtual pool or content unit is not stored on the CAS system that received the I/O request, the CAS system can forward the I/O request to the appropriate CAS system. The CAS system that receives the I/O request initially can be determined in any suitable manner, as the present invention is not limited in this respect. For example, one of the CAS systems can be designated to receive all I/O requests from the host 501, and can take on the responsibility of forwarding I/O requests intended for other CAS systems. It should be appreciated that the issuance of the I/O requests can be performed by any entity on the host computer, including an application program executing thereon.

An alternate embodiment of the present invention is illustrated in FIG. 5, which includes a layer 401 that handles the function of routing I/O communications to the appropriate one of the CAS systems to implement the logical segregation into multiple virtual pools. As discussed above, the CAS layer 401 may execute on the host computer, one of the CAS storage systems, and/or on a network component or separate appliance that is coupled to the host computer and the CAS system, as described in the above-referenced CAS layer application. The layer 401 can facilitate segregating the storage environment into multiple virtual pools in a manner that is transparent to the host 601, or alternatively, the host 601 may be made aware of the segregation into virtual pools, as the embodiment of the invention shown in FIG. 5 is not limited in this respect.

It should be appreciated that in one embodiment, the segregation into virtual pools may not only be transparent to the host 601, but also any application program executing thereon. For example, in the embodiment wherein different virtual pools are assigned to different application programs, the layer 401 can perform this segregation in a manner that is transparent to the application programs, as the I/O communications to and from each application program can simply be routed to the appropriate virtual pool without the application program being aware that the storage environment has been segregated into virtual pools. Of course, the invention is not limited in this respect, as the application programs can alternatively be made aware of the segregation into virtual pools. In addition, in some embodiments, an application program may be an active participant in determining requirements for one or more content units that may be relevant to which virtual pool the content unit is stored in (e.g., a storage capability), so that the application program may take an active part in selecting a virtual pool, at least by specifying one or more desired requirements for the storing of one or more content units.

In an alternate embodiment, virtual pools are not limited to being formed on separate storage systems, as a single storage system may have different logical and/or physical storage resources or nodes segregated to implement two or more virtual pools. It should be appreciated that this embodiment is not mutually exclusive with the above-described embodiment of FIG. 4, as these two embodiments can be employed together, so that different CAS systems can be segregated into different virtual pools, and one or more of the CAS systems may be further segregated to form multiple virtual pools.

Figure 6:
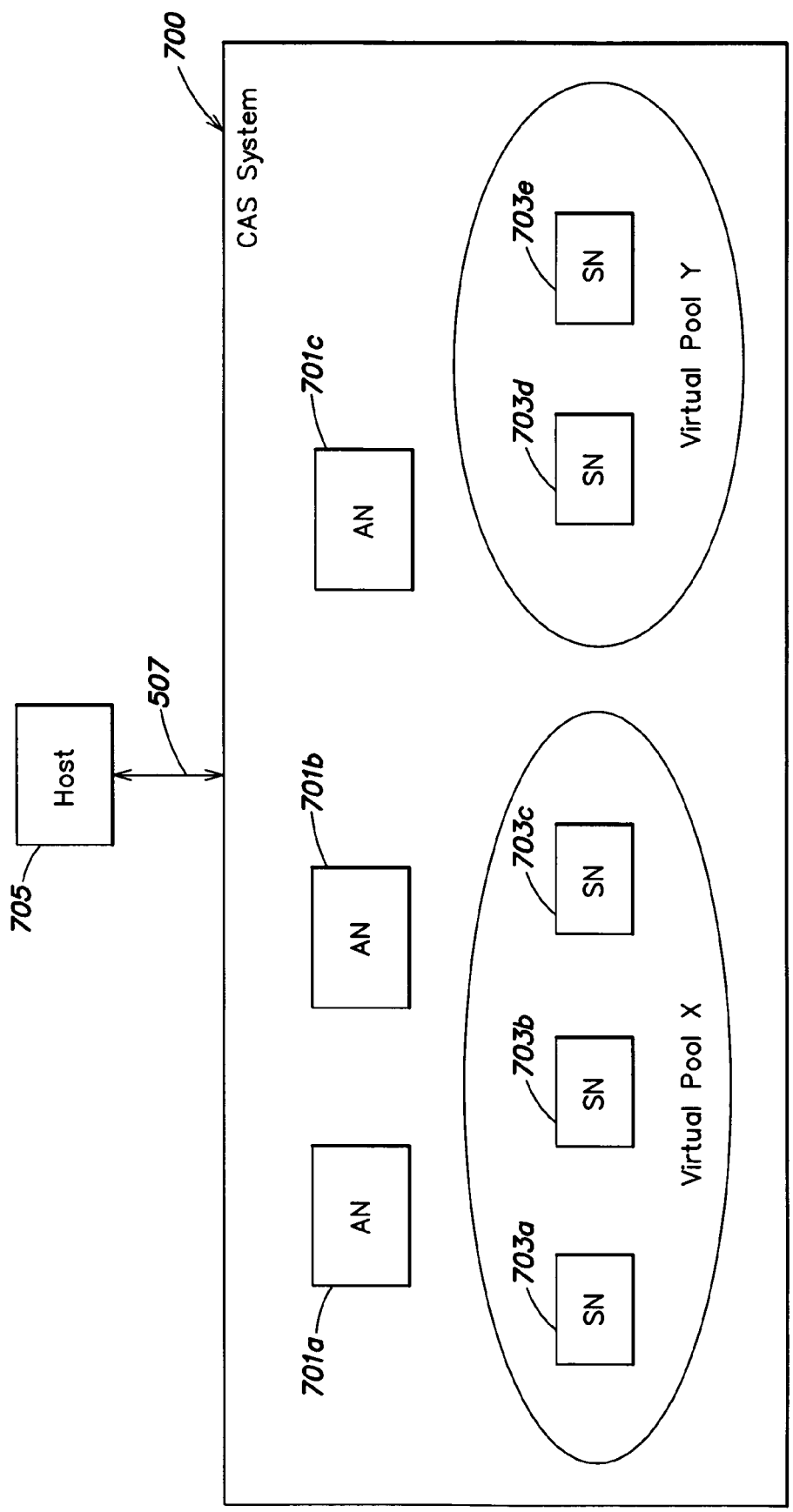
FIG. 6 illustrates a computer system including a CAS system in which storage nodes have been segregated into virtual pools in accordance with another embodiment of the present invention.

As mentioned above, the aspects of the present invention described herein are not limited to storage systems having any particular type of configuration, as the invention is not limited in this respect. Thus, the logical and/or physical storage resources or storage nodes within a storage system may be segregated to form virtual pools in any suitable manner, as the invention is not limited in this respect. One illustrative example is shown in FIG. 6 in connection with a storage system having an access node and storage node configuration of the type disclosed in several of the commonly assigned applications listed in Table 1. Again, this configuration is shown merely for illustrative purposes, as the present invention is not limited to use with a storage system including an access and storage node configuration. As used herein, the reference to a storage node is not limited to describing a storage resource used in a system having an access node and storage node configuration as shown in FIG. 6, and is used herein in a more generic sense to reference any physical and/or logical storage resource, examples of which include a logical volume of storage that may be presented by the CAS system, a physical storage device (e.g., a disk drive), or a storage resource that includes one or more processors together with one or more storage devices to form a unitary storage node.

CAS system 700 includes a plurality of access nodes 701a-701c and a plurality of storage nodes 703a-703e. Access nodes 701 may receive and respond to access requests from a host computer 705, which can be coupled to the storage system via any suitable communication link 507 as with embodiments discussed above. Storage nodes 703 may store data sent to CAS system 700 by host computer 705. Access nodes 701 and storage nodes 703 may be coupled by a network (not shown) or otherwise, and may communicate such that each node may make its presence known to the other nodes, so that the nodes together form a unitary storage system. A node may include processing resources (e.g., a processor and memory) and/or storage devices. The nodes communicate with each other to store data, respond to access requests, and perform other functions. To a user of the CAS system 700 (e.g., the host computer 705 or an application program executing thereon), the CAS system 700 may appear as single entity. That is, the user need not be aware that the storage environment includes a plurality of separate nodes or on which storage node a certain unit of data is stored.

FIG. 6 illustrates a computer system that includes a single host 705 and a single CAS system 700. As with all of the embodiments described herein, the embodiment illustrated in FIG. 6 is not limited to use in a computer system including this configuration, and can be employed in computer systems including multiple host computers and any number of CAS systems.

In the embodiment of FIG. 6, rather than allocating an entire storage system to each virtual pool, the storage nodes within a storage system may be allocated to different virtual pools. For example, storage nodes 703a-703c may store content units for a first virtual pool (virtual pool X), while storage nodes 703d and 703e may store content units for a second virtual pool (virtual pool Y). Thus, when CAS system 700 receives a request to store a content unit, the CAS system may determine in which virtual pool the content unit belongs and may store the unit of content on a storage node allocated to that virtual pool. Similarly, when processing other types of access requests (e.g., read requests, query requests, etc.), the storage system may determine in which virtual pool the requested unit of content is stored and use only the storage node(s) allocated to that virtual pool to process the request. For example, in responding to a read or query request, the storage system may search only the storage nodes allocated to the appropriate virtual pool to determine whether the desired content unit is stored in the CAS system 700. For example, if a read request is received from a host allocated to virtual pool X (FIG. 6) but seeks to read a content unit that is stored only on one of the storage nodes 703d-e allocated to the virtual pool Y, the CAS system 700 will respond to the read request by not returning the identified content unit, but rather, by denying access to the desired content unit. The denial can be performed in any of numerous ways, as the present invention is not limited in this respect. For example, the CAS system 700 could alert the requestor that the content unit is available on the CAS system 700 but that the requestor lacks appropriate access privileges, or system 700 might simply indicate that the request is denied without providing any information concerning whether the desired content unit is stored on another virtual pool.

In accordance with one embodiment of the present invention, the allocating of storage nodes in a CAS system to different virtual pools facilitates the tracking of characteristics of the content units stored in the CAS system, such as the number of content units stored in a particular virtual pool, the storage capacity allocated and/or actually used by a virtual pool, etc. For example, by allocating different storage nodes to different virtual pools, relevant information from each storage node can be extracted separately, and the knowledge concerning which storage nodes are allocated to each virtual pool can be used to determine the desired characteristic(s) for the virtual pool.

In another embodiment of the present invention, the segregation of the storage nodes to form multiple virtual pools can be used to facilitate the provision of different storage system capabilities to different virtual pools, as the different storage nodes can be configured differently to provide the desired storage system capabilities, examples of which are discussed above.

In FIG. 6, only storage nodes are segregated in virtual pools, such that an access request for content stored on a particular one of the storage nodes may be received and forwarded by any access node. However, in an alternate embodiment access nodes may also be segregated into virtual pools so that an access node may only handle access requests for content units in the same virtual pool as the access node. Alternatively, in other embodiments of the invention wherein content units are stored on both access and storage nodes, an access node may be segregated into a particular virtual pool so that it may store only content units belonging to that virtual pool, however the access node may receive and forward access requests for any content units, including those in other virtual pools.

In another embodiment of the present invention, virtual pools can be created without segregating storage resources of one or more CAS systems into a plurality of virtual pools, the boundaries of which are limited to the boundaries of a storage resource (e.g., a CAS system or a storage node). This logical segregation of one or more CAS systems into virtual pools can be accomplished in any of numerous ways, as this aspect of the present invention is not limited to any particular implementation technique. In accordance with one embodiment of the present invention, information is stored for each content unit allocated to a virtual pool, with the information identifying the virtual pool to which the content unit is allocated. The information can be stored in any suitable form, and in any suitable location, as this aspect of the present invention is not limited to any particular implementation technique.

One embodiment of the present invention is adapted for use with a system of the type described in at least some of the applications listed in Table 1, in which two different types of content units are stored on the storage system, i.e., a blob and a content descriptor file (CDF).

A blob is a first type of content unit that includes descriptive data (e.g., application data). A CDF is a second type of content unit that includes metadata (e.g., descriptive information) about another content unit such as a blob or other CDF, and may, but need not, include other data. For example, a blob may include data such as a patient's x-ray, whereas a CDF may include metadata relating to the x-ray such as when the x-ray was taken, the name of the patient depicted in the x-ray, etc. Each CDF may identify blobs related thereto by including the content address for the blob within the CDF, such that access to the blob can be achieved by first accessing the CDF to retrieve the content address for the blob, and then using the retrieved content address to access the blob. Although one embodiment of the present invention described herein is adapted for use with a system that employs a blob/CDF architecture, it should be appreciated that the aspect of the present invention that relates to creation of virtual pools without segregating storage resources in a CAS system is not limited to use with a system that employs a blob/CDF architecture, nor to use with the types of systems described in the applications listed in Table 1.

Figure 8:
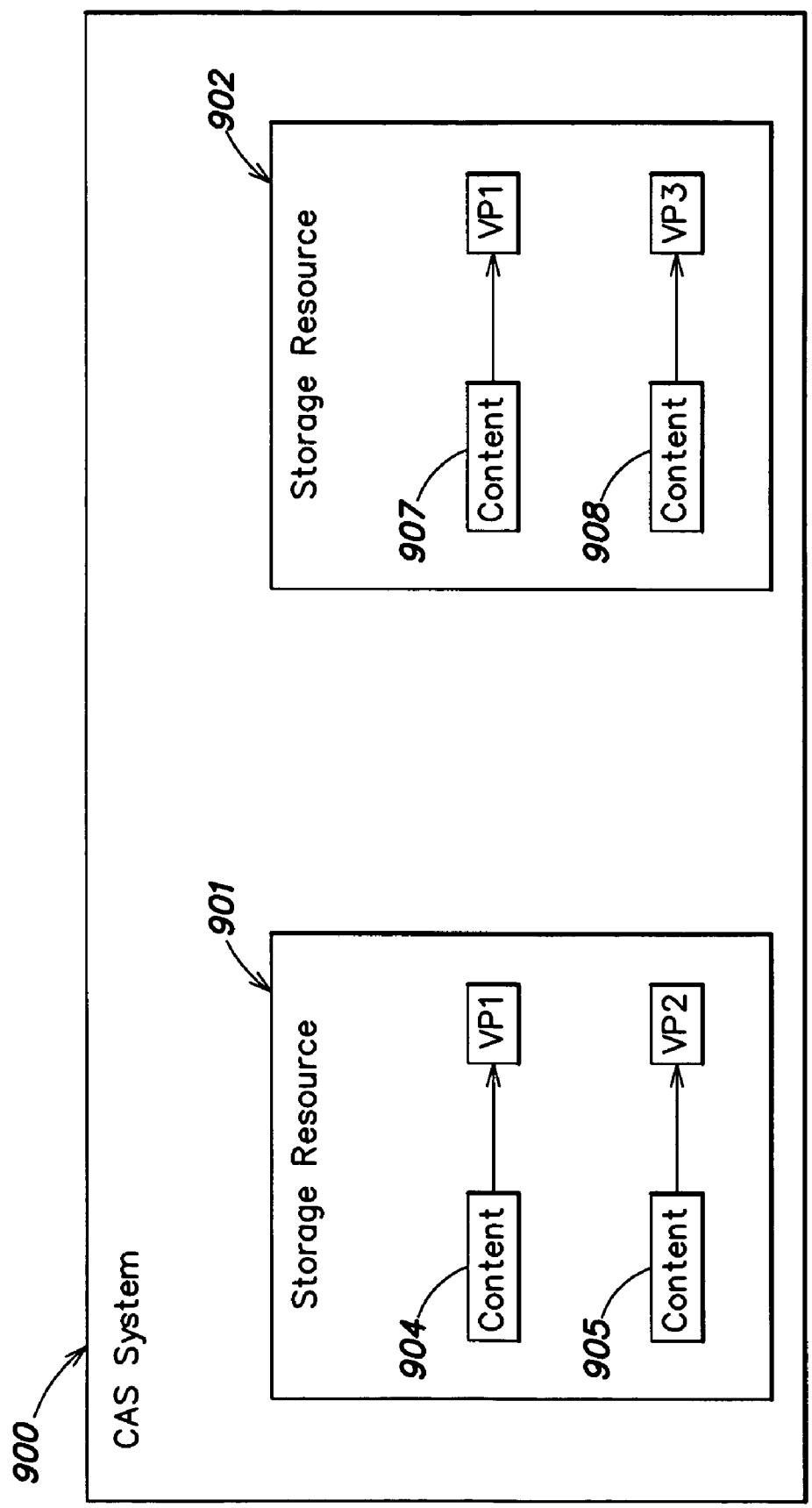
FIG. 8 conceptually illustrates a CAS system in which virtual pools are allocated without segregating storage resources.

In one embodiment, information identifying the virtual pool to which a blob belongs may be stored in the metadata of its corresponding CDF. As with all of the embodiments described herein wherein a virtual pool is not defined by particular storage resources in the CAS system, the CAS system may store content units in any available storage resources (e.g., storage nodes, CAS systems, logical volumes, physical storage devices, etc.) as it is not necessary to restrict the storage location of a content unit to ensure that it is assigned to an appropriate virtual pool. Thus, it is possible that one or more storage nodes may include content units that are assigned to different virtual pools, such that the storage node can be considered to be partitioned into multiple partitions that store content units in different virtual pools. This is illustrated conceptually in FIG. 8, wherein a CAS system is illustrated including two storage resources 901, 902. The storage resource 901 includes two content units 904, 905 assigned to different virtual pools. In this respect, content unit 904 is assigned to a first virtual pool identified as VP1 and the content unit 905 is assigned to a second virtual pool designated as VP2. The storage resource 902 includes two content units, with content unit 907 being assigned to virtual pool VP1 and content unit 908 being assigned to a virtual pool identified as VP3. Thus, each of the storage resources 901, 902 can be considered to include multiple partitions storing content units from different virtual pools, and the virtual pool VP1 can be considered to be distributed among the two storage resources 901, 902. It should be appreciated that the example of FIG. 8 is shown merely for illustrative purposes, and that the CAS system can include numerous storage resources, each including any number of content units, and the content units can be distributed in any desirable way among any desired number of virtual pools.

When an entity (e.g., the CAS system, a separate appliance, etc.) receives a request to access a blob, the entity may look at the corresponding CDF to determine which virtual pool the blob is allocated to. The entity may then determine if the requesting entity has permission to access the blob. For example, in response to a query, each candidate CDF can be opened and examined to determine the virtual pool to which the corresponding blob is assigned, for the purpose of determining whether the entity (e.g., a server, application program, user, etc.) that issued the query request has visibility to the virtual pool that includes the blob. Similarly, on a read or delete request, the appropriate CDF can be opened to ensure that the requester application has visibility to the virtual pool that includes the blob, and the access request can be granted only if so.

As discussed above, the aspects of the present invention disclosed herein do not relate to any particular storage system capabilities or the manner in which they are implemented. A storage system may have one or more tools or utilities that execute thereon and are responsible for implementing one or more storage system capabilities. For the embodiment of the present invention wherein information is stored in a CDF that identifies the virtual pool to which a corresponding content unit belongs, any tool or utility executing on a storage system to implement a storage system capability may first open the CDF for a blob to determine the virtual pool to which the blob belongs for the purpose of determining which storage system capabilities should be implemented therefor.

The identification of a virtual pool for a content unit (e.g., a blob) can be implemented in any of numerous of ways. For example, in accordance with one embodiment of the present invention, each CDF includes information that specifies a virtual pool to which the CDF belongs, and the CDF does not include any specific information relating to virtual pool assignments for blobs referenced thereby. Rather, each blob referenced by a CDF can be, by definition, included in the virtual pool that the CDF belongs to. If a blob is pointed to by two or more CDFs in different virtual pools, the blob will be present in each of those virtual pools. However, the aspect of the present invention that relates to storing virtual pool identification information for a content unit in a blob/CDF architecture is not limited to this implementation, as other implementations are possible. For example, each CDF could include separate virtual pool identification information for each blob referenced thereby, such that each blob can be directly allocated to a virtual pool, as opposed to indirect allocation through a CDF pointing to it.

As discussed above, the formation of virtual pools facilitates the tracking of various characteristics of content units sourced by different content sources. For the embodiment in which the virtual pool identification information is included in a CDF, desired information relating to a particular virtual pool (e.g., the number of blobs stored to the virtual pool, the storage capacity allocated to the storage pool, etc.) can be determined by opening the CDFs stored on the storage system to determine the virtual pool to which each blob belongs.

In the embodiments discussed above, the virtual pool identifier for a content unit is stored only in a CDF, such that a blob remains as a content unit that stores only data, and no metadata relating thereto. It should be appreciated that the invention is not limited in this respect, and that a virtual pool identifier for a blob can alternatively be stored in the blob itself.

It should be appreciated that there may be times when it is desirable to move one or more content units from one virtual pool to another. For example, some content units that may previously have been stored in a manner that would enable them to be deleted could take on a status where it is desirable to render the content non-deletable (e.g., if the content becomes relevant to a litigation). As discussed in at least some of the applications listed in Table 1, some systems that employ a CDF identify the CDF by a content address generated based, at least in part, on the content of the CDF. Thus, if a blob were to be moved to a new virtual pool, the identifier for the virtual pool included in the CDF could change, which could then result in the need to generate a new content address for the CDF. This may present difficulties for entities seeking to access the CDF, as they identify the CDF via its original content address. In accordance with one embodiment of the present invention, this difficulty can be overcome by storing the virtual pool identifiers for any blobs referenced by a CDF in a portion of the blob that is not used when generating the content address for the CDF.

In an alternate embodiment of the invention, the virtual pool identifier for a content unit such as a blob associated with a CDF is not stored within the blob or CDF itself, but rather, is stored external to the blob or an associated CDF. As a result, modifications to the virtual pool identifier do not modify the content of the blob or its corresponding CDF, which means that new content addresses for a modified blob or CDF need not be generated. The information identifying the virtual pool to which a content unit belongs can be stored in any suitable location, as this aspect of the present invention is not limited to any particular implementation.

In accordance with one embodiment of the present invention, the virtual pool identifiers for content units stored in a CAS system are stored in a table that is not included within the blobs or CDFs. The table can be stored in any suitable manner. For example, in one embodiment of the invention, the table may be included in a database, which may include entries for each content unit assigned to a virtual pool, with each entry including an identifier for the content unit (e.g., a content address for a blob or a CDF that points to a blob) and one or more associated virtual pool identifiers which identify the virtual pool(s) to which the content unit belongs. As with the embodiment discussed above wherein the virtual pool identifier is stored in the CDF, when a content unit is accessed, the database including information specifying the virtual pool for the content unit can be examined to retrieve that information, which then can be used in the ways described above.

When a content unit or its associated CDF is moved to a different pool, this can be accomplished simply by updating the virtual pool identifier in the database table.

In accordance with one embodiment of the present invention, a technique is employed to ensure that the information that identifies which virtual pool a content unit belongs to is recoverable in the event that the database table is corrupted or lost. This additional security can be provided in any of numerous ways, as the present invention is not limited to any particular implementation technique. In accordance with one embodiment of the present invention, the CAS system includes one or more file systems that manage the storage of content units (e.g., blobs and CDFs). On such systems, content units may be stored as files in the file system of the CAS system, and the virtual pool identifier for a content unit may be associated as an attribute with the file. In this manner, if the database were to crash, the virtual pool identifier can be retrieved as an attribute associated with the file.

In an alternate embodiment of the invention, a virtual pool identifier can be appended as a tag to the file that stores the associated content unit. Thus, if the database table entry corresponding to a blob or CDF is lost or corrupted, the information relating to the virtual pools for the content unit can be reconstructed from the tag stored with the associated file.

In the embodiments discussed above, the inclusion of the virtual pool identifier in a file attribute or a tag appended to a file is used as a back up in addition to the database look up. In an alternate embodiment of the invention, either of these techniques can be employed as the sole source for storing the virtual pool identifier, as a separate database table need not be employed.

In accordance with one embodiment of the present invention, the virtual pool identifier can be mapped (in any suitable way) to information that specifies a definition of storage system capabilities defined for the virtual pool. Thus, by specifying, in an I/O request sent to the CAS system, a virtual pool to which a content unit belongs, desired storage system capabilities for the content unit can be specified.

As discussed above, the aspect of the present invention that relates to specifying different storage system capabilities for different content units is not limited to use with virtual pools. Thus, it should be appreciated that the embodiment described herein wherein information can be stored for content units is not limited to storing a virtual pool identifier. Rather, information for each content unit can be stored that can be used to determine the desired storage system capabilities to be applied to the content unit. This information can take any of numerous forms, as this aspect of the present invention is not limited in this respect. For example, the information can directly specify the desired storage system capabilities. Alternatively, in another embodiment of the present invention, the information can specify a content source for the content unit, and the content source identifier can then be mapped (in any suitable way) to information that specifies a definition of the desired storage system capabilities for the content unit.

The information relating to the storage system capabilities to be applied to each content unit can be provided in any suitable way, as the present invention is not limited to any particular implementation technique. In accordance with one embodiment of the present invention, an I/O request seeking to store a content unit on a CAS system can include information specifying the desired storage system capabilities to be applied by the CAS system to the content unit. This can be done in any suitable way. For example, the information can be provided in a manner such that it is distinct from an identifier (e.g., a content address) used by the content source to identify the content unit.

Similarly, as discussed above, the embodiment of the present invention that relates to reporting and tracking characteristics of the content units stored on a storage system are not limited to use with virtual pools. Thus, as discussed immediately above, the information included in an I/O request that stores a content unit can identify, directly or indirectly, a content source for the I/O operation. This information can then be used to determine the impact of the I/O operation on a characteristic of the content units stored on the storage system by the content source that issued the I/O request. This can be done in any of numerous ways.

In accordance with one embodiment of the present invention, information can be extracted from I/O communications passing between a content source and the CAS system, the extracted information relating to an impact of the I/O communication on a characteristic of the content units stored in the CAS systems from the content source. Examples of such characteristics can include an amount of storage capacity used by the content source in a CAS system and the number of content units stored by the content source on the CAS system. The extracted information can be used in any of numerous ways to determine the impact of the I/O communication on these characteristics. For example, a running count can be maintained of the storage capacity and/or number of content units stored by a particular content source on the CAS system, and the extracted information can be used to increment or decrement the counter. Alternatively, the extracted information can be used to update a data repository that maintains information identifying the storage capacity or number of content units stored on the CAS system by a particular content source.

In an alternate embodiment of the present invention, rather than extracting information from I/O communications that relates to the impact of an I/O operation on the number of content units or storage capacity used by a content source in a CAS system, information can be stored along with the content units that can be used at a later time to determine such (or other desirable) characteristics. This stored information can take any suitable form, and can be stored in any suitable location. As one example, the information can identify the content source for each content unit, such that at a later point in time, content units on the storage system can be examined to determine the number of content units and/or storage capacity in the CAS system used by one or more content sources. The information can be in any suitable location. In one illustrative example, the information can be stored in a blob or CDF in a manner similar to the storage of the virtual pool identifier described above.

In the discussion above, each of the various techniques for forming multiple virtual pools in a storage environment has been described separately. However, it should be appreciated that these various techniques can be combined in a single storage environment, such that any two or more of these techniques can be employed together.

As merely one example of combining the techniques discussed above, the above-described technique for implementing virtual pools without segregating different storage resources to form the virtual pools can be selected as an initial technique for implementing one or more virtual pools on a CAS system. At some point in time, the storage capacity of the CAS system may become as fully utilized as desirable, and it may be desired to add another CAS system. In such an environment, another of the techniques described above could be used to segregate the two CAS systems so that different sets of one or more virtual pools could be formed on each, with each CAS system having multiple virtual pools being further segregated using the above-described technique that does not segregate based on storage system resources. Again, this is merely one example of a system that employs multiple of the above-described techniques in concert, and numerous other combinations are possible.

In another embodiment of the invention, virtual pools may be hierarchically arranged into one or more levels of superpools. Superpools can be employed to provide additional hierarchical organization of content within a CAS system, which can provide all of the above-described advantages at the different hierarchical levels, including logical segregation of content units, tracking CAS system resources employed by various content sources, and the implementation of different storage system capabilities.

Figure 7:
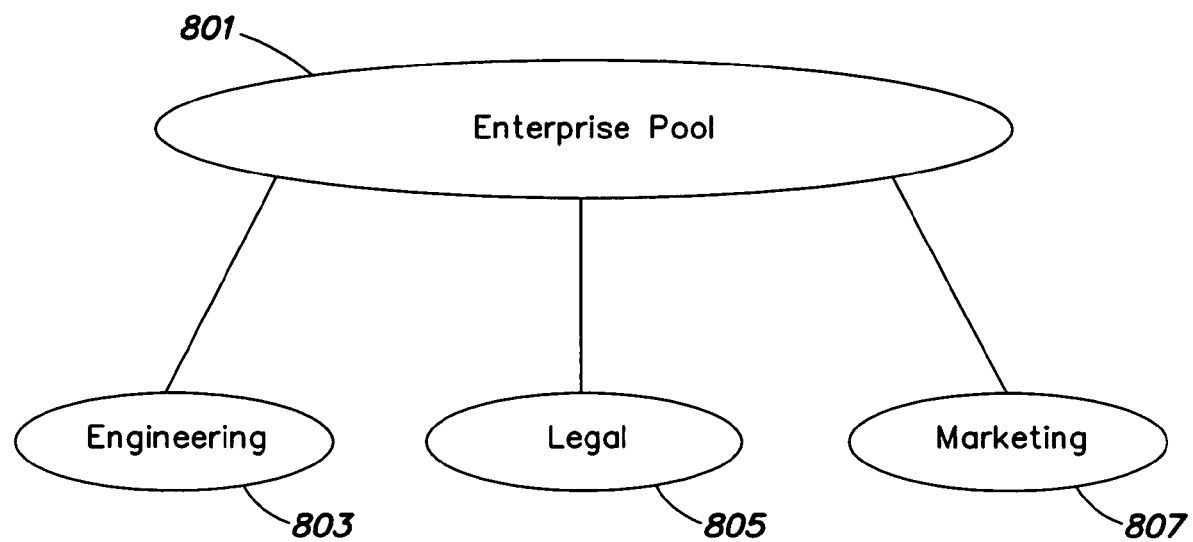
FIG. 7 illustrates the formation of a superpool in accordance with one embodiment of the present invention.

As an example, a storage environment may store data from a plurality of enterprises, such that it may be desirable to segregate the storage environment into different pools for the different enterprises. In addition, each enterprise may have a number of operating groups for which it is desirable to segregate the content units stored thereby. For example, a particular enterprise may include separate engineering, legal, and marketing groups, and it may be desirable to logically segregate the content units stored by these groups for any of the reasons discussed above (e.g., separate reporting on storage resource usage). As shown in the example of FIG. 7, separate pools 803, 805 and 807 can be formed for the engineering, legal and marketing groups, and these three pools can be combined to form a superpool 801 for the entire enterprise. Thus, each of the pools 803, 805 and 807 can be logically segregated in the manner described above, but the content units for all three pools can be logically grouped through their inclusion in the larger superpool 801. Thus, the storage environment can be segregated at the enterprise level, but also at a lower group level, which can provide a number of advantages as should be appreciated from the foregoing. When an access request is issued to the superpool 801, content units in each of the pools 803, 805 and 807 included therein can be considered in responding to the access request. In addition, as merely one example of the benefits of the use of superpools, the storage resources used by each of the engineering, legal and marketing groups can be tracked separately, but the storage resources for the entire enterprise can also be conveniently tracked by using the above-described techniques for tracking usage of the superpool 801.

It should be appreciated that while in FIG. 7 a two level hierarchy of virtual pools is shown, a hierarchy of superpools may have any number of levels, as the invention is not limited in this respect.

In one embodiment of the invention, reporting of the number of content units or storage capacity consumed by the content units of a virtual pool or sourced from a particular content source may be performed. In embodiments that rely on segregating storage system resources to logically separate content units of different virtual pools or from different content sources, the storage capacity may be determined simply by totaling the storage space used on each of the physical partitions (e.g., storage systems or storage nodes) allocated to the virtual pool or to store content from a particular content source. In the embodiments wherein segregating of storage system resources is not used, capacity reporting may be achieved by keeping a running count of the storage capacity used for each virtual pool. Each time a write is performed to a virtual pool, the storage capacity consumed by the content units written is added to the running count of the virtual pool. Alternatively, the capacity used by a virtual pool can be determined by performing a search for all content units in a virtual pool and summing the storage capacity consumed by each of these content units.

Figure 9:
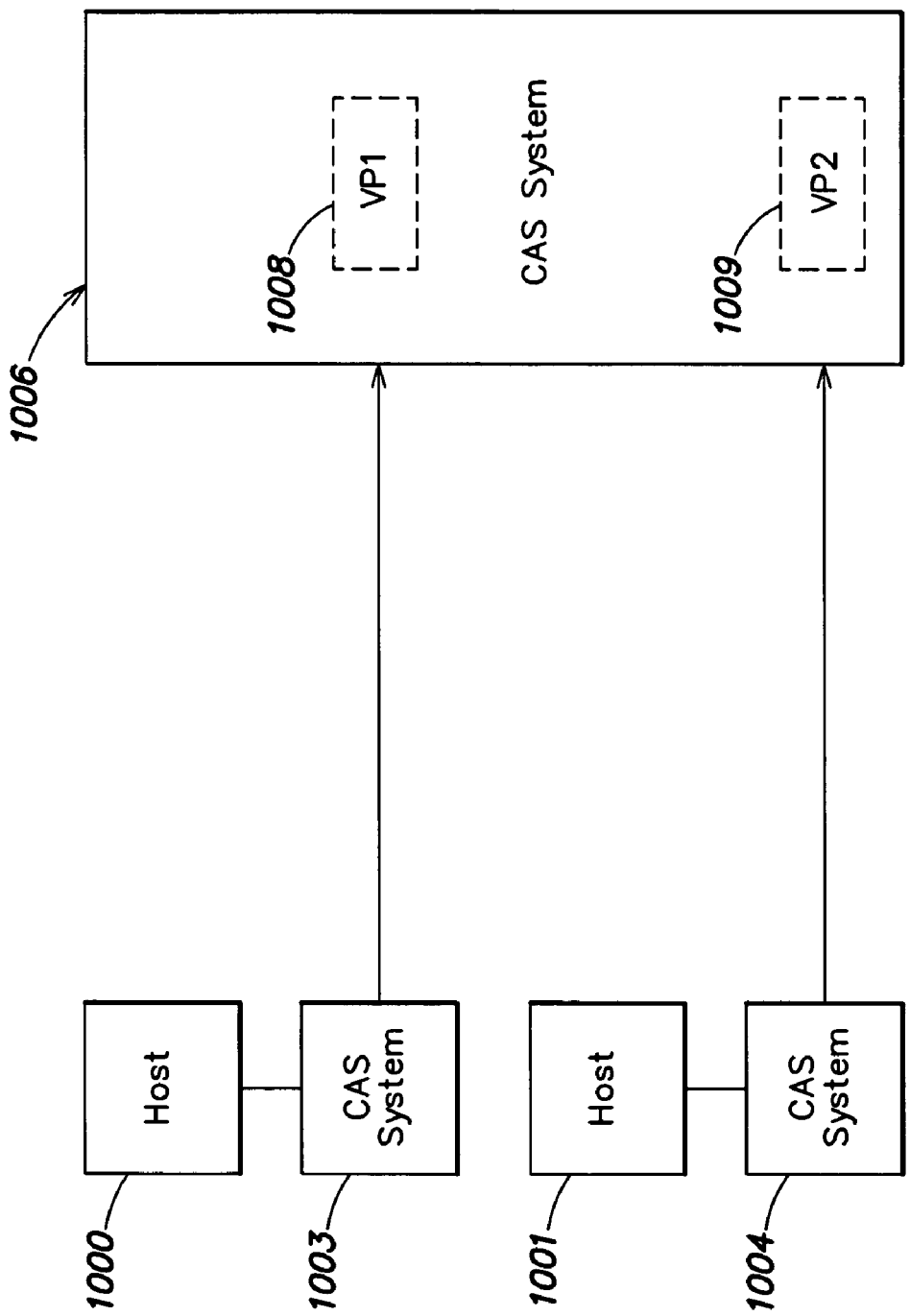
FIG. 9 illustrates a computer system in which multiple CAS systems act as content sources to another CAS system and the content units stored thereby are segregated into virtual pools in accordance with one embodiment of the present invention.

As mentioned above, the aspects of the present invention described herein can be used with numerous types of content sources, one example of which is a storage system. FIG. 9 illustrates an example of a computer system configuration on which aspects of the present invention can be employed to provide virtual pools for a content source that includes a storage system.

More specifically, FIG. 9 illustrates a computer system that includes host computers 1000, 1001 and local CAS systems 1003, 1004, respectively, to provide storage therefore. In addition, connections are provided from the CAS systems 1003, 1004 to another CAS system 1006 to provide replication of the data for fault tolerance reasons. The replication of data on the CAS system 1006 can be accomplished in any of numerous ways, as the present invention is not limited to any particular technique. In accordance with one embodiment of the present invention, the CAS system 1006 can serve as a remote data facility that may be physically remote from the CAS systems 1003, 1004 to provide additional security, although the aspects of the present invention described herein are not limited in this respect.

In the embodiment disclosed in FIG. 9, the content sourced from the CAS system 1003 is stored in a first virtual pool 1008, identified as virtual pool VP1, and content sourced from the CAS system 1004 is stored in a second virtual pool 1009, identified as VP2, in CAS system 1006.

In accordance with one embodiment of the present invention, the segregation of the content from multiple CAS systems to different virtual pools in a centralized repository can be employed to facilitate restoration of the content to one or more of the CAS systems 1003, 1004 in the event of the loss thereon. For example, by segregating the content on the CAS system 1006 into virtual pools based upon the different content sources, when it becomes desirable to restore the content onto CAS system 1003 or a replacement therefore that is local to host 1000, the content from virtual pool 1008 can be read from the CAS system 1006. This enables a group of one or more CAS systems to serve as a repository for replicated content from multiple CAS systems while facilitating easy restoration in the event one of the CAS systems fails.

Figure 11:
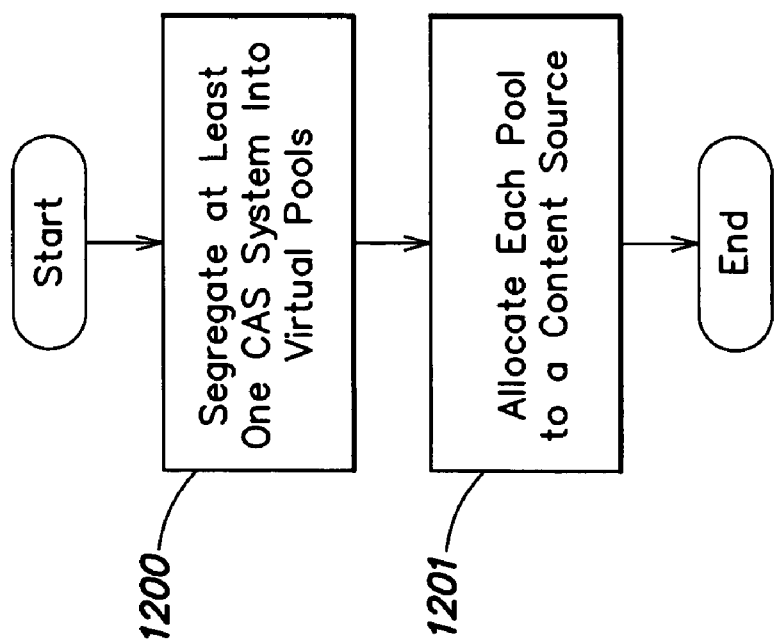
FIG. 11 is a method of segregating at least one CAS system into virtual pools and allocating each to a content source in accordance with one embodiment of the present invention.

As should be appreciated from the foregoing, one aspect of the present invention is directed to a method for segregating one or more CAS systems into a plurality of virtual pools, as well as one or more apparatus for performing such a method. A process for performing this method is shown in FIG. 11. Specifically, in act 1200, at least one CAS system is segregated into multiple virtual pools, and then in act 1201, each pool is allocated to a content source. This method can be performed by a system administrator, or any apparatus (or combination of apparatuses) in a computer system, including by one or more host computers, one or more CAS systems, one or more network components and/or one or more separate appliances as discussed above.

Figure 12:
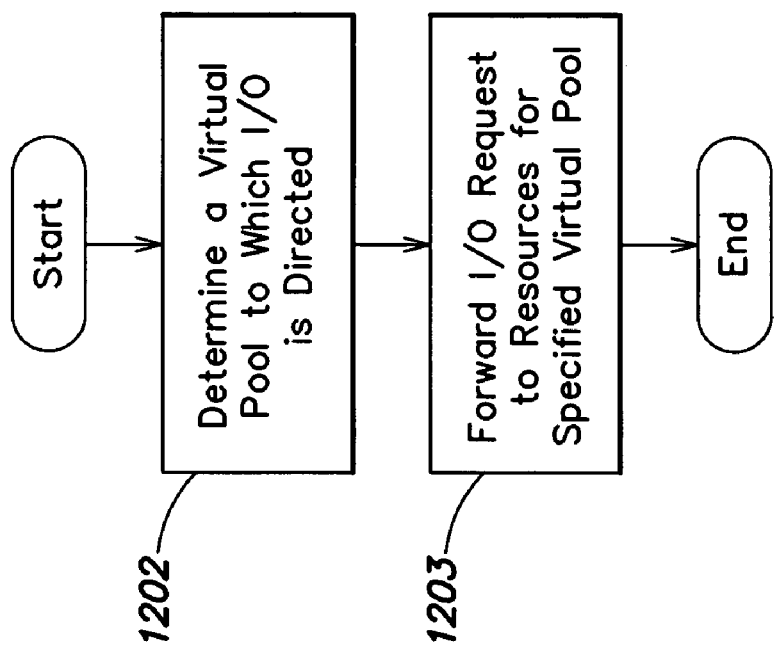
FIG. 12 illustrates a method of determining a virtual pool to which an I/O is directed and forwarding the I/O to storage resources for the specified virtual pool in accordance with another embodiment of the present invention.

Another embodiment of the present invention is directed to a technique for responding to an I/O request by determining a virtual pool to which the request is directed, and forwarding the request to a set of storage resources that comprise the virtual pool. A method for implementing this technique is illustrated in FIG. 12. In act 1202, a determination is made as to the virtual pool to which an I/O request is directed, and in act 1203, the I/O request is directed to the storage resources for the identified virtual pool. This method can be implemented in any suitable way and by any suitable component (or combination) in a computer system, including a separate layer as discussed above, or by a CAS system that receives I/O requests and is capable of forwarding one or more requests to another CAS system (e.g., in a federation) on which a specified virtual pool is stored.

Figure 13:
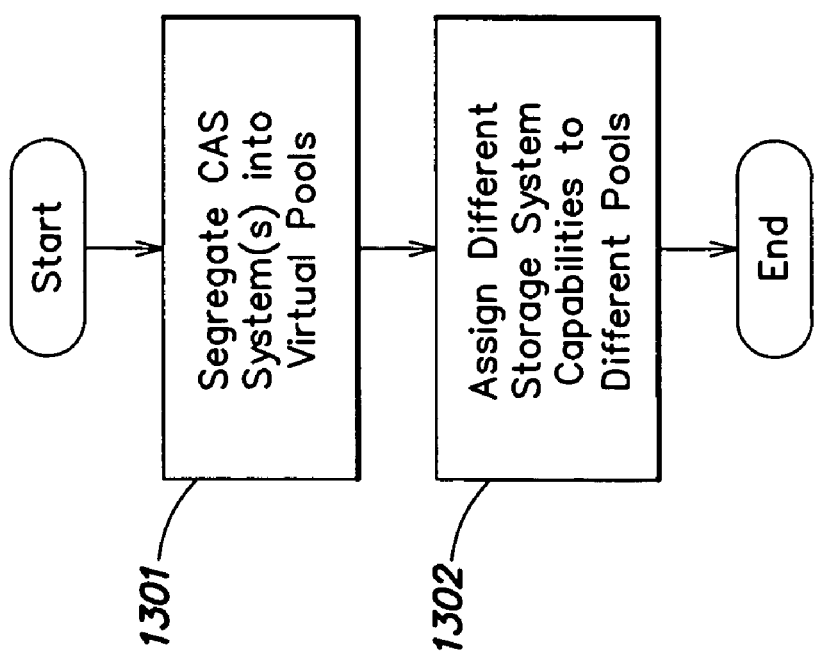
FIG. 13 is directed to a method of segregating a CAS system into virtual pools and assigning different storage system capabilities to the pools in accordance with another embodiment of the present invention.

Another embodiment of the present invention is directed to segregating one or more CAS systems into a plurality of virtual pools, and assigning different storage system capabilities to at least two of the virtual pools. A method for implementing this aspect of the present invention is illustrated in FIG. 13. In act 1301, one or more CAS systems are segregated into virtual pools, and in act 1302 different storage system capabilities are assigned to different virtual pools. It should be appreciated that this aspect of the present invention can be implemented by a system administrator, and/or by any suitable component (or combination) in a computer system, including one or more host computers, one or more CAS systems, a network component and/or a separate appliance as discussed above.

Figure 14:
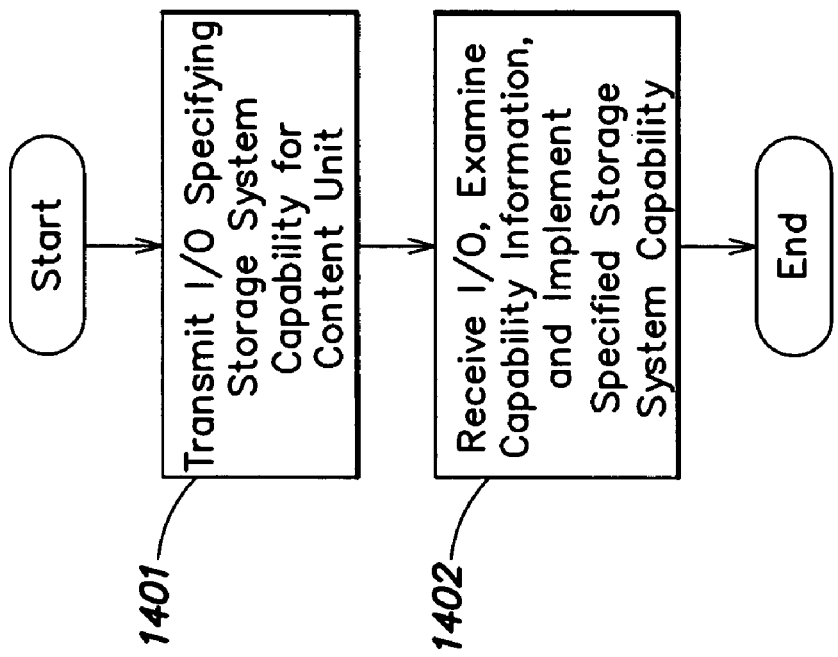
FIG. 14 illustrates a method of transmitting an I/O including information specifying one or more storage system capabilities for a content unit and using the information to implement the specified storage system capability in accordance with another embodiment of the present invention.

In another embodiment of the present invention, at least one I/O request issued from a host specifies at least one storage capability to be applied by a CAS system thereto, and the CAS system examines the capability information and implements the desired storage system capabilities. A process for implementing this aspect of the present invention is illustrated in FIG. 14. In act 1401, an I/O is transmitted specifying the storage system capability for a content unit. This act can be performed by a host computer (or application program executing thereon) or any other content source. In act 1402, the I/O is received, the information specifying at least one storage system capability is examined, and the specified storage system capability is implemented. The act 1402 can be performed by one or more of the CAS systems, a CAS layer or any other suitable component (or combination) in the system.

Figure 15:
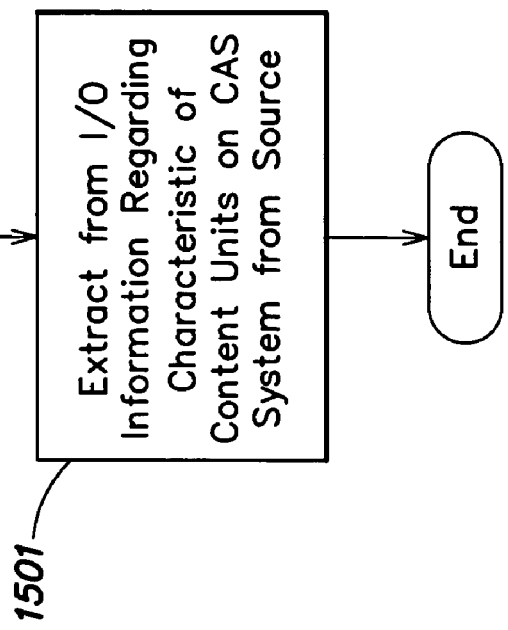
FIG. 15 illustrates a method of extracting from an I/O information regarding a characteristic of content units on a CAS system stored by the source of the I/O in accordance with another embodiment of the present invention.

Another embodiment is directed to extracting from at least one I/O communication passing between a first content source and a CAS system information relating to an impact of the I/O communication on at least one characteristic of the content units (e.g., the number or storage capacity used by) stored in the CAS system from the content source. A method for implementing this aspect of the present invention is shown in FIG. 15, wherein act 1501 performs the extraction. It should be appreciated that this aspect of the present invention can be performed by the content source itself, the CAS system, a CAS layer (which can be implemented on a host computer, the CAS system, an appliance or a network component), or by any other suitable component (or combination) in the computer system.

Figure 16:
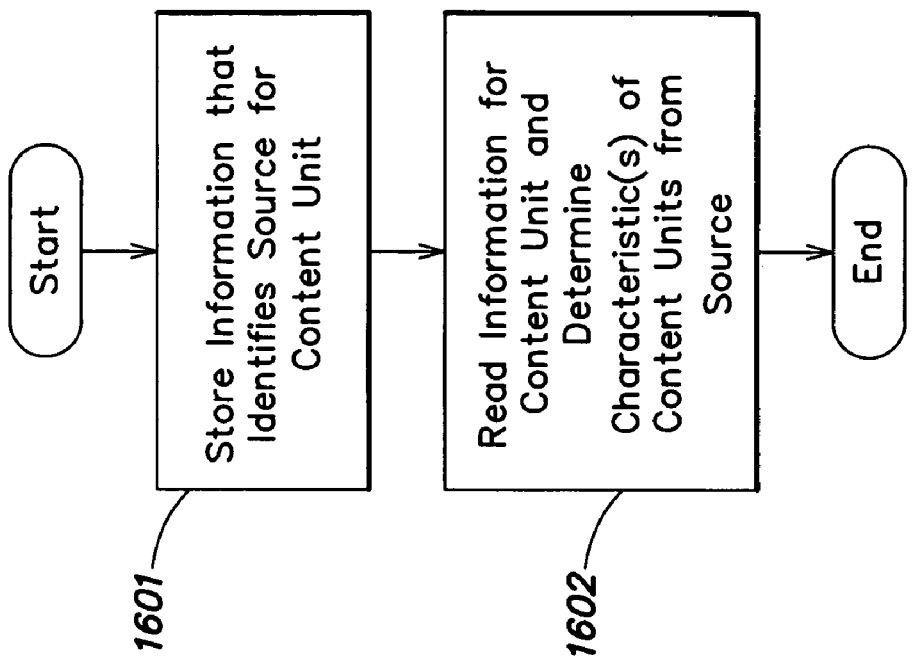
FIG. 16 illustrates a method of storing information that identifies the source for a content unit and reading that information to determine a characteristic of content units stored by that source in accordance with another embodiment of the invention.

Another embodiment of the present invention is directed to, in association with storing a content unit from a content source, storing information that identifies the content source for the content unit, and later reading that information to determine at least one characteristic of the content units stored from that source. A process for implementing this aspect of the present invention is illustrated in FIG. 16. In act 1601, information that identifies the source for the content unit is stored. This act can be performed by any component in the computer system, including the content source (e.g., a host computer), by a CAS layer, one or more CAS systems, or any other suitable component (or combination thereof) in the system. In act 1602, the information is read, and based at least in part thereon, a determination is made of at least one characteristic of the content units stored in the CAS system from the content source. As with the act 1601, this act can be performed by any suitable component (or combination) in the computer system, including the content source, one or more host computers or servers in the computer system, an appliance, one or more of the CAS systems, or any other suitable component.

The above-described embodiments of the present invention can be implemented on any suitable CAS system. Examples of suitable CAS systems are described in the patent applications listed below in Table 1, each of which is herein incorporated by reference. It should be appreciated that the CAS systems described in these applications are only examples of CAS systems on which embodiments of the present invention may be implemented, as the invention is not limited to implementation on any of these CAS systems.

In the embodiments shown in the Figures, storage systems are content addressable storage (CAS) systems. However, it should be appreciated that all aspects of the present invention are not limited in this respect, as aspects of the present invention can be used with other types of storage systems (e.g., block I/O storage systems).

TABLE 1

| Title | Ser. No. | Filing Date |
|---|---|---|
| Content Addressable Information, Encapsulation, Representation, And Transfer | 09/236,366 | Jan. 21, 1999 |
| Access To Content Addressable Data Over A Network | 09/235,146 | Jan. 21, 1999 |
| System And Method For Secure Storage Transfer And Retrieval Of Content Addressable Information | 09/391,360 | Sep. 7, 1999 |
| Method And Apparatus For Data Retention In A Storage System | 10/731,790 | Dec. 9, 2003 |
| Methods And Apparatus For Facilitating Access To Content In A Data Storage System | 10/731,613 | Dec. 9, 2003 |
| Methods And Apparatus For Caching A Location Index In A Data Storage System | 10/731,796 | Dec. 9, 2003 |
| Methods And Apparatus For Parsing A Content Address To Facilitate Selection Of A Physical Storage Location In A Data Storage System | 10/731,603 | Dec. 9, 2003 |

TABLE 1-continued

| Title | Ser. No. | Filing Date |
| --- | --- | --- |
| Methods And Apparatus For Generating A Content Address To Indicate Data Units Written To A Storage System Proximate In Time | 10/731,845 | Dec. 9, 2003 |
| Methods And Apparatus For Modifying A Retention Period For Data In A Storage System | 10/762,044 | Jan. 21, 2004 |
| Methods And Apparatus For Extending A Retention Period For Data In A Storage System | 10/761,826 | Jan. 21, 2004 |
| Methods And Apparatus For Indirectly Identifying A Retention Period For Data In A Storage System | 10/762,036 | Jan. 21, 2004 |
| Methods And Apparatus For Indirectly Identifying A Retention Period For Data In A Storage System | 10/762,043 | Jan. 21, 2004 |
| Methods And Apparatus For Increasing Data Storage Capacity | 10/787,337 | Feb. 26, 2004 |
| Methods And Apparatus For Storing Data In A Storage Environment | 10/787,670 | Feb. 26, 2004 |
| Methods And Apparatus For Processing Access Requests In A Content Addressable Computer System | 10/836,415 | Apr. 30, 2004 |
| Methods And Apparatus For Forwarding Access Requests In A Content Addressable Computer System | 10/837,311 | Apr. 30, 2004 |
| Methods And Apparatus For Transferring Data In A Content Addressable Computer System | 10/836,502 | Apr. 30, 2004 |

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

Figure 10:
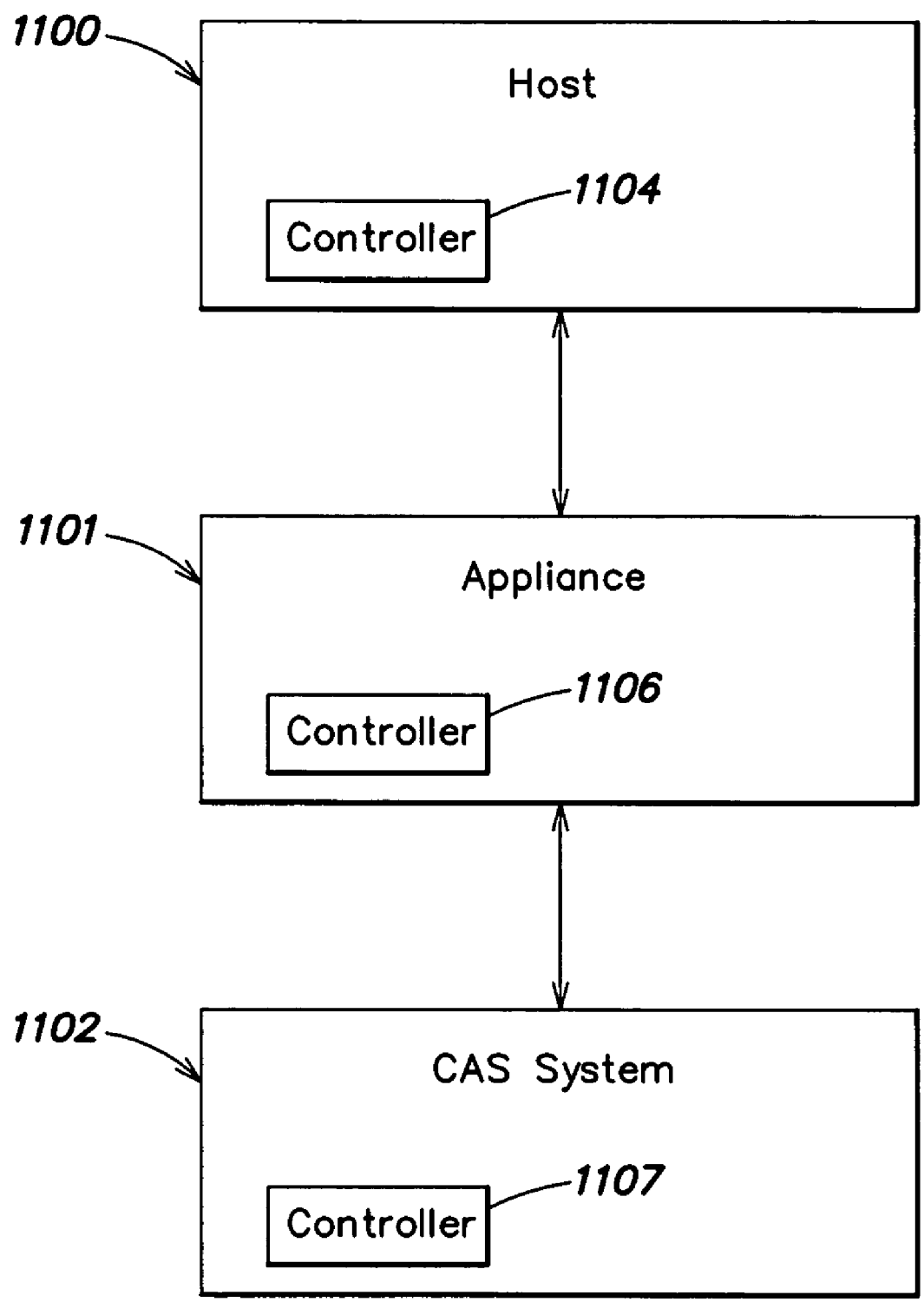
FIG. 10 illustrates a computer system in which each of a host computer, appliance and CAS system has a controller that can implement one or more aspects of the present invention.

As mentioned above, numerous aspects of the embodiments of the present invention described herein can be implemented in any suitable location in the computer system, such that each of a host computer, appliance, network component and/or CAS system can include a controller to perform the aspects of the present invention described herein, with the functionality described herein being performed separately in one or more of the controllers, or being distributed over multiple controllers. This is illustrated conceptually in FIG. 10, which illustrates a simple computer system that includes a host 1100, appliance 1101 and a CAS system 1102, which include controllers 1104, 1106, and 1107, respectively, that each may implement aspects of the present invention described herein. It should be appreciated that the present invention is not limited in this respect, and that there need not be at least one controller in each of the components shown in FIG. 10. In addition, as described above, the present invention can be employed on computer systems including numerous other configurations, as the present invention is not limited to use on a computer system having the configuration shown in FIG. 10.

It should be appreciated that one implementation of the embodiments of the present invention comprises at least one computer-readable medium (e.g., a computer memory, a floppy disk, a compact disk, a tape, etc.) encoded with a computer program (i.e., a plurality of instructions), which, when executed on a processor, performs the above-discussed functions of the embodiments of the present invention. The computer-readable medium can be transportable such that the program stored thereon can be loaded onto any computer environment resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

It should be appreciated that in accordance with several embodiments of the present invention wherein processes are implemented in a computer readable medium, the computer implemented processes may, during the course of their execution, receive input manually (e.g., from a user).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method of processing input/output (I/O) requests in a computer system, comprising:
in response to receipt of a first I/O request from a host to read a requested content unit stored on at least one content addressable storage (CAS) system of the computer system, wherein the CAS system includes a plurality of virtual pools, each virtual pool of the plurality of virtual pools storing content units that are logically segregated from content units stored in other of the plurality of virtual pools, determining, prior to accessing the CAS system to obtain the requested content unit, at least one of the plurality of virtual pools of the CAS system in which the requested content unit is stored, wherein each virtual pool from the plurality of virtual pools is assigned to at least one content source before receiving from the at least one content source any I/O requests to read content, wherein the at least one content source includes at least one of: a host, an application program or a storage system, and wherein the at least one virtual pool storing the requested content unit is accessed by a content source allocated to the at least one virtual pool, the content source being permitted to access only the at least one virtual pool assigned to the content source;

forwarding the first I/O request to a set of storage resources that include the at least one of the plurality of virtual pools to which the first I/O request is directed;

accessing the requested content unit from the set of storage resources; and returning the requested content unit to the host.

2. The method of claim 1, wherein determining at least one of the plurality of virtual pools is performed by the at least one CAS system.

3. The method of claim 1, wherein determining at least one of the plurality of virtual pools is performed by a CAS layer disposed outside of the at least one CAS system.

4. The method of claim 3, wherein the computer system further comprises at least one appliance separate from the host and the at least one CAS system, and wherein the CAS layer is disposed on the at least one appliance.

5. The method of claim 1, wherein the at least one CAS system includes a federation of CAS systems having at least first and second CAS systems and wherein forwarding the first I/O request includes forwarding the first I/O request to the at least one of the CAS systems that includes the set of storage resources that comprise the virtual pool in which the requested content unit is stored.

6. The method of claim 1, wherein the at least one CAS system includes a plurality of storage nodes having at least first and second groups of storage nodes and wherein forwarding the first I/O request includes forwarding the first I/O request to the at least one of the storage nodes that includes the set of storage resources that comprise the virtual pool in which the requested content unit is stored.

7. The method of claim 1, wherein the at least one CAS system includes a plurality of storage nodes, wherein at least one of the storage nodes is partitioned into multiple storage node partitions, and wherein forwarding the first I/O request includes forwarding the first I/O request to the at least one of the storage node partitions that includes the set of storage resources that comprise the virtual pool in which the requested content unit is stored.

8. The method of claim 1, wherein the first I/O request is directed to a single one of the plurality of virtual pools.

9. The method of claim 1, wherein the first I/O request is directed to a super pool comprising two or more of the plurality of virtual pools.

10. At least one computer readable medium encoded with instructions that, when executed on a computer system, perform a method of processing input/output (I/O) requests, the method comprising:

in response to receipt of a first I/O request from a host to read a requested content unit stored on at least one content addressable storage (CAS) system of the computer system, wherein the CAS system includes a plurality of virtual pools, each virtual pool of the plurality of virtual pools storing content units that are logically segregated from content units stored in other of the plurality of virtual pools, determining, prior to accessing the CAS system to obtain the requested content unit, at least one of the plurality of virtual pools of the CAS system in which the requested content unit is stored, wherein each virtual pool from the plurality of virtual pools is assigned to at least one content source before receiving from the at least one content source any I/O requests to read content, wherein the at least one content source includes at least one of: a host, an application program or a storage system, and wherein the at least one virtual pool storing the requested content unit is accessed by a content source allocated to the at least one virtual pool, the content source being permitted to access only the at least one virtual pool assigned to the content source;

forwarding the first I/O request to a set of storage resources that include the at least one of the plurality of virtual pools to which the first I/O request is directed;

accessing the requested content unit from the set of storage resources; and returning the requested content unit to the host.

11. The at least one computer readable medium of claim 10, wherein determining at least one of the plurality of virtual pools of the CAS system is performed by the at least one CAS system.

12. The at least one computer readable medium of claim 10, wherein determining at least one of a plurality of virtual pools of the CAS system in which the requested content unit is stored performed by a CAS layer disposed outside of the at least one CAS system.

13. The at least one computer readable medium of claim 12, wherein computer system further comprises at least one appliance separate from the host and the at least one CAS system, and wherein the CAS layer is disposed on the at least one appliance.

14. The at least one computer readable medium of claim 10, wherein the at least one CAS system includes a federation of CAS systems having at least first and second CAS systems and wherein forwarding the first I/O request includes forwarding the first I/O request to the at least one of the CAS systems that includes the set of storage resources that comprise the virtual pool in which the requested content unit is stored.

15. The at least one computer readable medium of claim 10, wherein the at least one CAS system includes a plurality of storage nodes having at least first and second groups of storage nodes and wherein forwarding the first I/O request includes forwarding the first I/O request to the at least one of the storage nodes that includes the set of storage resources that comprise the virtual pool in which the requested content unit is stored.

16. The at least one computer readable medium of claim 10, wherein the at least one CAS system includes a plurality of storage nodes, wherein at least one of the storage nodes is partitioned into multiple storage node partitions, and wherein forwarding the first I/O request includes forwarding the first I/O request to the at least one of the storage node partitions that includes the set of storage resources that comprise the virtual pool in which the requested content unit is stored.

17. The at least one computer readable medium of claim 10, wherein the first I/O request is directed to a single one of the plurality of virtual pools.

18. The at least one computer readable medium of claim 10, wherein the first I/O request is directed to a super pool comprising two or more of the plurality of virtual pools.

19. An apparatus for use in a computer system, comprising:
an input adapted to receive input/output (I/O) requests; and
at least one processor, coupled to the input, adapted to:
in response to receipt of a first I/O request from a host to read a requested content unit stored on at least one content addressable storage (CAS) system of the computer system, wherein the CAS system includes a plurality of virtual pools, each virtual pool of the plurality of virtual pools storing content units that are logically segregated from content units stored in other of the plurality of virtual pools, determine, prior to accessing the CAS system to obtain the requested content unit, at least one of the plurality of virtual pools of the CAS system in which the requested content unit is stored, wherein each virtual pool from the plurality of virtual pools is assigned to at least one content source before receiving from the at least one content source any I/O requests to read content, wherein the at least one content source includes at least one of: a host, an application program or a storage system, and wherein the at least one virtual pool storing the requested content unit is accessed by a content source allocated to the at least one virtual pool, the content source being permitted to access only the at least one virtual pool assigned to the content source;

forward the first I/O request to a set of storage resources that include the at least one of the plurality of virtual pools to which the first I/O request is directed;

access the requested content unit from the set of storage resources; and return the requested content unit to the host.

20. The apparatus of claim 19, wherein the at least one processor is disposed on the host.

21. The apparatus of claim 19, wherein the at least one processor is disposed on the at least one CAS system.

22. The apparatus of claim 19, wherein the computer system includes at least one appliance separate from the host and the at least one CAS system, and wherein the apparatus is disposed on the at least one appliance.

23. The apparatus of claim 19, wherein the at least one processor executes a CAS layer of software disposed outside of the at least one CAS system.

24. The apparatus of claim 23, wherein the computer system further comprises at least one appliance separate from the host and the at least one CAS system, and wherein the CAS layer is disposed on the at least one appliance.

25. The apparatus of claim 19, wherein the at least one CAS system comprises a federation of a plurality of CAS systems, and wherein the at least one processor is adapted to:

determine at least one of the CAS systems that includes storage resources included in the set of storage resources that comprise the virtual pool in which the requested content unit is stored; and forward the first I/O request to the at least one of the CAS systems that includes storage resources included in the set of storage resources that comprise the virtual pool to which the first I/O request is directed.

26. The apparatus of claim 19, wherein the at least one CAS system comprises a plurality of storage nodes and wherein the at least one processor is adapted to:

determine at least one of the storage nodes that includes storage resources included in the set of storage resources that comprise the virtual pool in which the requested content unit is stored; and forward the first I/O request to the at least one of the storage nodes.

27. The apparatus of claim 19, wherein the at least one CAS system comprises a plurality of storage nodes, wherein at least one of the storage nodes is partitioned into multiple partitions, and wherein the at least one processor is adapted to:

determine at least one of the storage node partitions that includes storage resources included in the set of storage resources that comprise the virtual pool in which the requested content unit is stored; and forward the first I/O request to the at least one of the storage node partitions.

28. The apparatus of claim 19, wherein the first I/O request is directed to a single one of the plurality of virtual pools and wherein the at least one processor is adapted to determine the single one of the plurality of virtual pools.

29. The apparatus of claim 19, wherein the first I/O request is directed to a super pool comprising two or more of the plurality of virtual pools and wherein the at least one processor is adapted to determine the two more of the plurality of virtual pools included in the super pool.

30. A method for use in a computer system, comprising:

issuing a first input/output (I/O) request to at least one content addressable storage (CAS) system of the computer system to request access to at least one requested content unit stored on the at least one CAS system, wherein the CAS system includes a plurality of virtual pools, each virtual pool of the plurality of virtual pools storing content units that are logically segregated from content units stored in other of the plurality of virtual pools, wherein the first I/O request includes information identifying at least one of the plurality of virtual pools of the CAS system, wherein the I/O request is issued prior to accessing the requested content unit, wherein each virtual pool from the plurality of virtual pools is assigned to at least one content source before receiving from the the at least one content source any I/O requests to read content, wherein the at least one content source includes at least one of: a host, an application program or a storage system, and wherein the at least one virtual pool storing the requested content unit is accessed by a content source allocated to the at least one virtual pool, the content source being permitted to access only the at least one virtual pool assigned to the content source; and in response to issuing the first I/O request, receiving from the at least one CAS system the at least one requested content unit.

31. The method of claim 30, wherein the first I/O request is a request to write the at least one content unit to the at least one of the plurality of virtual pools identified in the first I/O request.

32. The method of claim 30, wherein the first I/O request is a request to read the at least one content unit from the at least one of the plurality of virtual pools identified in the first I/O request.

33. The method of claim 30, wherein the first I/O request is a query for information relating to content units in the at least one of the plurality of virtual pools identified in the first I/O request.

34. The method of claim 30, wherein issuing a first input/output (I/O) request includes providing information that identifies the at least one of the plurality of virtual pools in a manner that is distinct from the identifier used by a host to access the at least one content unit.

35. The method of claim 30, further comprising:

selecting at least one of the plurality of virtual pools for the at least one content unit, wherein the first I/O request includes information that identifies the selected one of the plurality of the virtual pools.

36. The method of claim 35, wherein at least two of the plurality of virtual pools provide different storage system capabilities for content units stored therein, and wherein at least one of the plurality of virtual pools is selected based on the storage system capabilities desired for the at least one content unit.

37. The method of claim 35, wherein issuing, receiving, and selecting are performed by at least one application program.

38. The method of claim 30, wherein the at least one CAS system includes a plurality of storage nodes having at least a first node partitioned into at least first and second partitions, with a first portion of the plurality of virtual pools being stored, at least in part, on the first partition and a second portion of the plurality of virtual pools being stored, at least in part, on the second partition.

39. The method of claim 30, wherein the at least one CAS system includes a federation of a plurality of CAS systems and wherein a first portion of the plurality of virtual pools is stored on one of the CAS systems and a second portion of the plurality of virtual pools is stored on an other one of the CAS systems.

40. The method of claim 30, wherein the at least one CAS system includes a plurality of storage nodes having at least first and second groups of storage nodes, wherein each of the first and second groups includes at least one storage node, wherein a first portion of the plurality of virtual pools is stored on the first group of storage nodes and a second portion of the plurality of virtual pools is stored on the second group of storage nodes.

41. The method of claim 30, wherein each of the plurality of virtual pools includes a different set of storage resources in the at least one CAS system.

42. At least one computer readable medium encoded with instructions that, when executed on at least one host computer in a computer system, perform a method, the method comprising:
    issuing a first input/output (I/O) request to at least one content addressable storage (CAS) system of the computer system to request access to at least one requested content unit stored on the at least one CAS system, wherein the CAS system includes a plurality of virtual pools, each virtual pool of the plurality of virtual pools storing content units that are logically segregated from content units stored in other of the plurality of virtual pools, wherein the first I/O request includes information identifying at least one of the plurality of virtual pools of the CAS system, wherein the I/O request is issued prior to accessing the requested content unit, wherein each virtual pool from the plurality of virtual pools is assigned to at least one content source before receiving from the the at least one content source any I/O requests to read content, wherein the at least one content source includes at least one of: a host, an application program or a storage system, and wherein the at least one virtual pool storing the requested content unit is accessed by a content source allocated to the at least one virtual pool, the content source being permitted to access only the at least one virtual pool assigned to the content source; and
    in response to issuing the first I/O request, receiving from the at least one CAS system the at least one requested content unit.

43. The at least one computer readable medium of claim 42, wherein the first I/O request is a request to write the at least one content unit to the at least one of the plurality of virtual pools identified in the first I/O request.

44. The at least one computer readable medium of claim 42, wherein the first I/O request is a request to read the at least one content unit from the at least one of the plurality of virtual pools identified in the first I/O request.

45. The at least one computer readable medium of claim 42, wherein the first I/O request is a query for information relating to content units in the at least one of the plurality of virtual pools identified in the first I/O request.

46. The at least one computer readable medium of claim 42, wherein issuing a first input/output (I/O) request includes providing information that identifies the at least one of the plurality of virtual pools in a manner that is distinct from the identifier used by a host to access the at least one content unit.

47. The at least one computer readable medium of claim 42, wherein the method further comprises:
    selecting at least one of the plurality of virtual pools for the at least one content unit, wherein the first I/O request includes information that identifies the selected one of the plurality of the virtual pools.

48. The at least one computer readable medium of claim 47, wherein at least two of the plurality of virtual pools provide different storage system capabilities for content units stored therein, and wherein at least one of the plurality of virtual pools is selected based on the storage system capabilities desired for the at least one content unit.

49. The at least one computer readable medium of claim 47, wherein issuing, receiving, and selecting are performed by at least one application program.

50. The at least one computer readable medium of claim 42, wherein the at least one CAS system includes a plurality of storage nodes having at least a first node partitioned into at least first and second partitions, with a first portion of the plurality of virtual pools being stored, at least in part, on the first partition and a second portion of the plurality of virtual pools being stored, at least in part, on the second partition.

51. The at least one computer readable medium of claim 42, wherein the at least one CAS system includes a federation of a plurality of CAS systems and wherein a first portion of the plurality of virtual pools is stored on one of the CAS systems and a second portion of the plurality of virtual pools is stored on an other one of the CAS systems.

52. The at least one computer readable medium of claim 42, wherein the at least one CAS system includes a plurality of storage nodes having at least first and second groups of storage nodes, wherein each of the first and second groups includes at least one storage node, wherein a first portion of the plurality of virtual pools is stored on the first group of storage nodes and a second portion of the plurality of virtual pools is stored on the second group of storage nodes.

53. The at least one computer readable medium of claim 42, wherein each of the plurality of virtual pools includes a different set of storage resources in the at least one CAS system.

54. A host computer for use in a computer system, comprising:
    an output adapted to issue input/output (I/O) requests; and
    a processor, coupled to the at least one output, adapted to:
    issue a first input/output (I/O) request to at least one content addressable storage (CAS) system of the computer system to request access to at least one requested content unit stored on the at least one CAS system, wherein the CAS system includes a plurality of virtual pools, each virtual pool of the plurality of virtual pools storing content units that are logically segregated from content units stored in other of the plurality of virtual pools, wherein the first I/O request includes information identifying at least one of the plurality of virtual pools of the CAS system, wherein the I/O request is issued prior to accessing the requested content unit, wherein each virtual pool from the plurality of virtual pools is assigned to at least one content source before receiving from the the at least one content source any I/O requests to read content, wherein the at least one content source includes at least one of: a host, an application program or a storage system, and wherein the at least one virtual pool storing the requested content unit is accessed by a content source allocated to the at least one virtual pool, the content source being permitted to access only the at least one virtual pool assigned to the content source; and receive from the at least one CAS system the at least one requested content unit, in response to issuing the first I/O request.

55. The host computer of claim 54, wherein the first I/O request is a request to write the at least one content unit to the at least one of the plurality of virtual pools identified in the first I/O request.

56. The host computer of claim 54, wherein the first I/O request is a request to read the at least one content unit from the at least one of the plurality of virtual pools identified in the first I/O request.

57. The host computer of claim 54, wherein the first I/O request is a query for information relating to content units in the at least one of the plurality of virtual pools identified in the first I/O request.

58. The host computer of claim 54, wherein the at least one processor is adapted to include in the first I/O request information that identifies the at least one of the plurality of virtual pools in a manner that is distinct from the identifier used by the host to access the at least one content unit.

59. The host computer of claim 54, wherein the processor is adapted to select at least one of the plurality of virtual pools for the at least one content unit, wherein the first I/O request includes information that identifies the selected one of the plurality of the virtual pools.

60. The host computer of claim 59, wherein at least two of the plurality of virtual pools provide different storage system capabilities for content units stored therein, and wherein at least one of the plurality of virtual pools is selected based on the storage system capabilities desired for the at least one content unit.

61. The host computer of claim 59, wherein processor is adapted to execute at least one application program that issues the first I/O request to the at least one CAS system, selects at least one of the plurality of virtual pools for the at least one content unit, and includes information in the first I/O request that identifies the selected one of the plurality of virtual pools.

62. The host computer of claim 54, wherein the at least one CAS system includes a plurality of storage nodes having at least a first node partitioned into at least first and second partitions, with a first portion of the plurality of virtual pools being stored, at least in part, on the first partition and a second portion of the plurality of virtual pools being stored, at least in part, on the second partition.

63. The host computer of claim 54, wherein the at least one CAS system includes a federation of a plurality of CAS systems and wherein a first portion of the plurality of virtual pools is stored on one of the CAS systems and a second portion of the plurality of virtual pools is stored on an other one of the CAS systems.

64. The host computer of claim 54, wherein the at least one CAS system includes a plurality of storage nodes having at least first and second groups of storage nodes, wherein each of the first and second groups includes at least one storage node, wherein a first portion of the plurality of virtual pools is stored on the first group of storage nodes and a second portion of the plurality of virtual pools is stored on the second group of storage nodes.

65. The host computer of claim 54, wherein each of the plurality of virtual pools comprises a different set of storage resources in the at least one CAS system.

66. The method of claim 1, wherein the requested content unit is a content descriptor file that includes in its content a content address for at least one other content unit and metadata that describes the content of the at least one other content unit.

* * * * *